(12) United States Patent
Hong

(10) Patent No.: US 11,637,148 B2
(45) Date of Patent: Apr. 25, 2023

(54) DISPLAY APPARATUS

(71) Applicant: Samsung Display Co., Ltd., Yongin-si (KR)

(72) Inventor: Sangmin Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 51 days.

(21) Appl. No.: 16/932,803

(22) Filed: Jul. 19, 2020

(65) Prior Publication Data

US 2021/0183959 A1 Jun. 17, 2021

(30) Foreign Application Priority Data

Dec. 12, 2019 (KR) .................. 10-2019-0166000

(51) Int. Cl.
| | | |
|---|---|---|
| *H01L 29/06* | (2006.01) | |
| *H01L 21/00* | (2006.01) | |
| *H01L 27/32* | (2006.01) | |
| *H01L 51/50* | (2006.01) | |

(52) U.S. Cl.
CPC ...... *H01L 27/3206* (2013.01); *H01L 51/5088* (2013.01); *H01L 2251/558* (2013.01)

(58) Field of Classification Search
CPC ............. H01L 27/3206; H01L 51/5296; H01L 2251/5307–533
USPC ............................ 438/29, 32, 35; 257/89, 98
See application file for complete search history.

(56) References Cited

U.S. PATENT DOCUMENTS

| | | | |
|---|---|---|---|
| 8,698,395 B2 | 4/2014 | Im et al. | |
| 9,142,795 B2 | 9/2015 | Kim et al. | |
| 10,002,910 B2 | 6/2018 | Oh et al. | |
| 10,581,011 B2* | 3/2020 | Chen | H01L 51/5044 |
| 10,720,478 B2* | 7/2020 | Kondo | H01L 51/5265 |
| 10,879,327 B2* | 12/2020 | Tanaka | H01L 27/3246 |
| 11,139,451 B2* | 10/2021 | Choi | H01L 27/323 |
| 11,239,290 B2* | 2/2022 | Jang | H01L 51/5237 |
| 2021/0043706 A1* | 2/2021 | Kobayashi | H01L 27/3218 |

FOREIGN PATENT DOCUMENTS

| | | | | |
|---|---|---|---|---|
| JP | 2021028883 | * | 8/2019 | ......... H01L 27/3218 |
| KR | 10-0573110 | | 4/2006 | |
| KR | 10-0700013 | | 3/2007 | |
| KR | 10-2014-0140410 | | 12/2014 | |
| KR | 10-2017-0052766 | | 5/2017 | |
| KR | 10-2017-0073989 | | 6/2017 | |

* cited by examiner

*Primary Examiner* — Calvin Lee
(74) *Attorney, Agent, or Firm* — H.C. Park & Associates, PLC

(57) ABSTRACT

A display apparatus includes: a substrate including a substantially flat area and a curved area extending from the substantially flat area; a first pixel electrode arranged in the curved area; a first emission layer disposed on the first pixel electrode; a second pixel electrode arranged in the substantially flat area; a second emission layer disposed on the second pixel electrode; a first functional layer having a first thickness disposed between the first pixel electrode and the first emission layer; and a second functional layer having a second thickness disposed between the second pixel electrode and the second emission layer. The first thickness is greater than the second thickness.

18 Claims, 17 Drawing Sheets

(1 of 17 Drawing Sheet(s) Filed in Color)

DISPLAY APPARATUS

CROSS-REFERENCE TO RELATED APPLICATION

This application claims priority from and the benefit of Korean Patent Application No. 10-2019-0166000, filed on Dec. 12, 2019, which is hereby incorporated by reference for all purposes as if fully set forth herein.

BACKGROUND

Field

Exemplary implementations of the invention relate generally to a display apparatus, and more particularly, to a display apparatus having a curved display area with an improved viewing angle.

Discussion of the Background

Display apparatus visually displays images. In general, a display apparatus is used as a display of a small product such as a cellular phone or a display of a large product such as a television.

Among types of the display apparatus, there is a flexible display apparatus having a flexible material. This includes a curved display apparatus that may maintain display performance even when the display panel is bent to form a bent and/or curved area.

Recently, as interest in the flexible display apparatus increases, studies on this have been actively conducted, and in this regard, various attempts have been made to minimize the viewing angle difference due to bending of the display panel.

The above information disclosed in this Background section is only for understanding of the background of the inventive concepts, and, therefore, it may contain information that does not constitute prior art.

SUMMARY

Display apparatus having display panels with a curved area constructed according to the principles and exemplary implementations of the invention express colors with improved reliability. The display apparatus may improve and/or reduce differences in colors perceived according to the viewing angle of curved display area. For example, the thickness of at least one layer of a pixel in the bending area may be adjusted to reduce the difference in colors.

Additional features of the inventive concepts will be set forth in the description which follows, and in part will be apparent from the description, or may be learned by practice of the inventive concepts.

According to one aspect of the invention, a display apparatus includes: a substrate including a substantially flat area and a curved area extending from the substantially flat area; a first pixel electrode arranged in the curved area; a first emission layer disposed on the first pixel electrode; a second pixel electrode arranged in the substantially flat area; a second emission layer disposed on the second pixel electrode; a first functional layer having a first thickness disposed between the first pixel electrode and the first emission layer; and a second functional layer having a second thickness disposed between the second pixel electrode and the second emission layer. The first thickness is greater than the second thickness.

The first thickness may vary according to an angle between an imaginary line parallel to an upper surface of the substantially flat area and a tangent of a point on an upper surface of the curved area.

The first thickness may increase as the angle increases.

The display apparatus further includes: a third pixel electrode arranged in the curved area; a third emission layer disposed on the third pixel electrode; and a third functional layer having a third thickness disposed between the third pixel electrode and the third emission layer. The third pixel electrode may be spaced further apart from the substantially flat area than the first pixel electrode, and the third thickness may be greater than the first thickness.

The display apparatus may further include: a first auxiliary layer having a first auxiliary thickness disposed between the first functional layer and the first emission layer; and a third auxiliary layer having a third auxiliary thickness disposed between the third functional layer and the third emission layer. The third auxiliary thickness may be less than the first auxiliary thickness.

The display apparatus may further include: a first auxiliary layer having a first auxiliary thickness disposed between the first functional layer and the first emission layer; and a second auxiliary layer having a second auxiliary thickness disposed between the second functional layer and the second emission layer. The first auxiliary thickness may be less than the second auxiliary thickness.

The first auxiliary thickness may vary according to an angle between an imaginary line parallel to an upper surface of the substantially flat area and a tangent of a point on an upper surface of the curved area.

The first auxiliary thickness may decrease as the angle increases.

The first functional layer and the second functional layer may be integrally formed.

The first functional layer and the second functional layer may include hole injection layers.

According to another aspect of the invention, a display apparatus includes: a substrate including a substantially flat area and a curved area extending from the substantially flat area; a first pixel electrode arranged in the curved area; a first emission layer overlapping the first pixel electrode; a second pixel electrode arranged in the substantially flat area; a second emission layer overlapping the second pixel electrode; a first functional layer disposed between the first pixel electrode and the first emission layer; a second functional layer disposed between the second pixel electrode and the second emission layer; a first auxiliary layer having a first thickness disposed between the first functional layer and the first emission layer; and a second auxiliary layer having a second thickness disposed between the second functional layer and the second emission layer. The first emission layer and the second emission layer are configured to emit light of a first color, and the first thickness is less than the second thickness.

The display apparatus may further include: a third pixel electrode arranged in the curved area; a third emission layer overlapping the third pixel electrode; a fourth pixel electrode arranged in the substantially flat area; a fourth emission layer overlapping to the fourth pixel electrode; a third functional layer disposed between the third pixel electrode and the third emission layer; a fourth functional layer disposed between the fourth pixel electrode and the fourth emission layer; a third auxiliary layer having a third thickness disposed between the third functional layer and the third emission layer; and a fourth auxiliary layer having a fourth thickness disposed between the fourth functional layer and the fourth emission layer. The third emission layer and the fourth emission layer may be configured to emit light of a second color different from the first color, and the third thickness may be less than the fourth thickness.

The first thickness may vary according to an angle between an imaginary line parallel to an upper surface of the substantially flat area and a tangent of a point on an upper surface of the curved area.

The first thickness may decrease as the angle increases.

The first thickness may be less than the third thickness.

The light of the first color may have a green wavelength, and the light of the second color may have a red wavelength.

The display apparatus may further include: a third pixel electrode arranged in the curved area; a third emission layer corresponding to the third pixel electrode; a third functional layer disposed between the third pixel electrode and the third emission layer; and a third auxiliary layer has a third thickness disposed between the third functional layer and the third emission layer. The third emission layer may be configured to emit the light of the first color, the third pixel electrode may be spaced further apart from the substantially flat area than the first pixel electrode, and the third thickness may be less than the first thickness.

The first auxiliary layer and the second auxiliary layer may be separated from each other.

The first functional layer and the second functional layer may be integrally formed.

According to still another aspect of the invention, a display apparatus includes: a substrate including a substantially flat area and a curved area extending from the substantially flat area; a first pixel electrode arranged in the curved area; a first emission layer overlapping the first pixel electrode; a second pixel electrode arranged in the substantially flat area; a second emission layer overlapping the second pixel electrode; a first functional layer disposed between the first pixel electrode and the first emission layer; and a second functional layer disposed between the second pixel electrode and the second emission layer. The first emission layer and the second emission layer are configured to emit light of the same color, and the first functional layer and the second functional layer have different thicknesses.

It is to be understood that both the foregoing general description and the following detailed description are exemplary and explanatory and are intended to provide further explanation of the invention as claimed.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
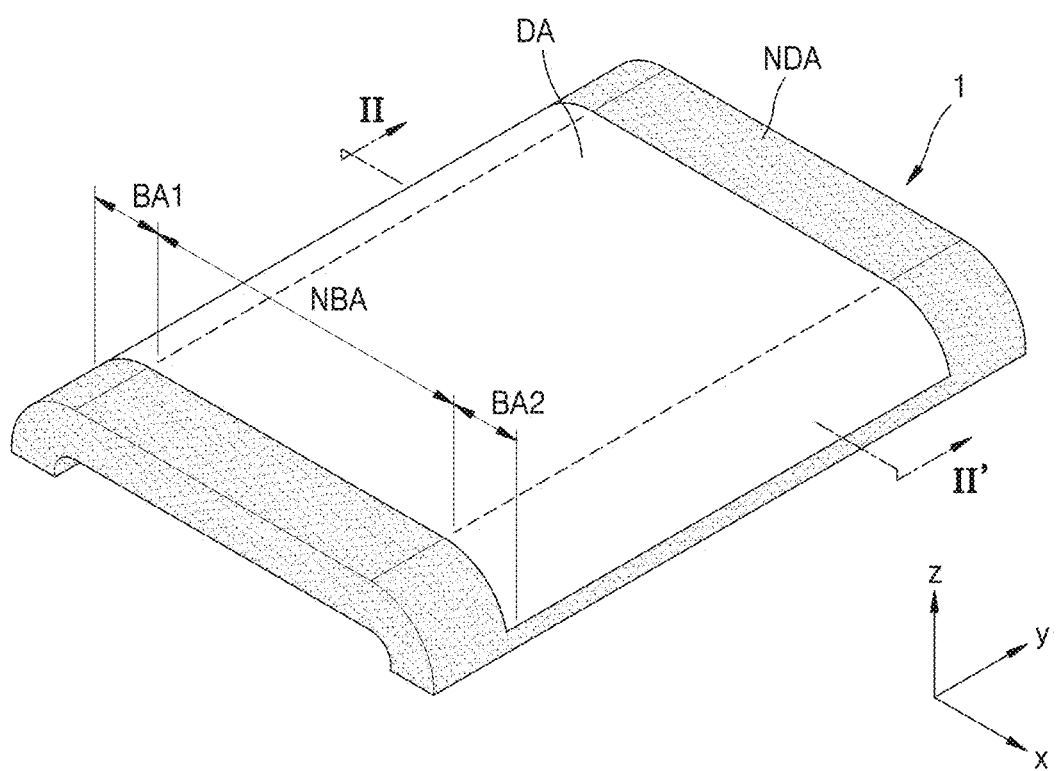
FIG. 1 is a schematic perspective view of an exemplary embodiment of a display apparatus constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic perspective view of an exemplary embodiment of a display apparatus constructed according to the principles of the invention.

Referring to FIG. 1, a display apparatus 1 includes a display area DA where light is emitted and a non-display area NDA where no light is emitted. The non-display area NDA is adjacent to the display area DA. The display apparatus 1 may provide an image by using light emitted from a plurality of pixels arranged in the display area DA.

While FIG. 1 shows the display area DA having a quadrilateral shape, exemplary embodiments are not limited thereto. For example, the shape of the display area DA may be a circle, an oval, or a polygon such as a triangle or a pentagon.

While an organic light-emitting display apparatus is described as an example of the display apparatus 1 according to an exemplary embodiment, the display apparatus described herein is not limited thereto. According to another exemplary embodiment, the display apparatus described herein may be a display apparatus such as a quantum dot light-emitting display apparatus or other known types of display apparatus.

A plurality of pixels P (refer to FIG. 5) may be arranged in the display area DA. Hereinafter, each pixel P refers to a sub-pixel that emits light of a color such as red (R), green (G), and blue (B). Each pixel P may be, for example, one of a red (R) sub-pixel, a green (G) sub-pixel, and a blue (B) sub-pixel.

The non-display area NDA is an area where no image is provided, and a scan driver and a data driver for providing electrical signals to be applied to the pixels P of the display area DA and power lines for providing power such as a driving voltage and a common voltage may be arranged in the non-display area NDA.

The display apparatus 1 includes a substantially flat area, which may be in the form a non-bending area NBA and first and second curved areas, which may be in the form of bending areas BA1 and BA2. The first and second bending areas BA1 and BA2 of the display apparatus 1 extend from the non-bending area NBA and are bent at a certain radius curvature. The first and second bending areas BA1 and BA2 may be provided on either end or both ends of the display apparatus 1. The non-bending area NBA and the first and second bending areas BA1 and BA2 of the display apparatus 1 may both be used as a display screen, and thus, a user may recognize an image via the non-bending area NBA and the first and second bending areas BA1 and BA2 of the display apparatus 1.

Figure 2:
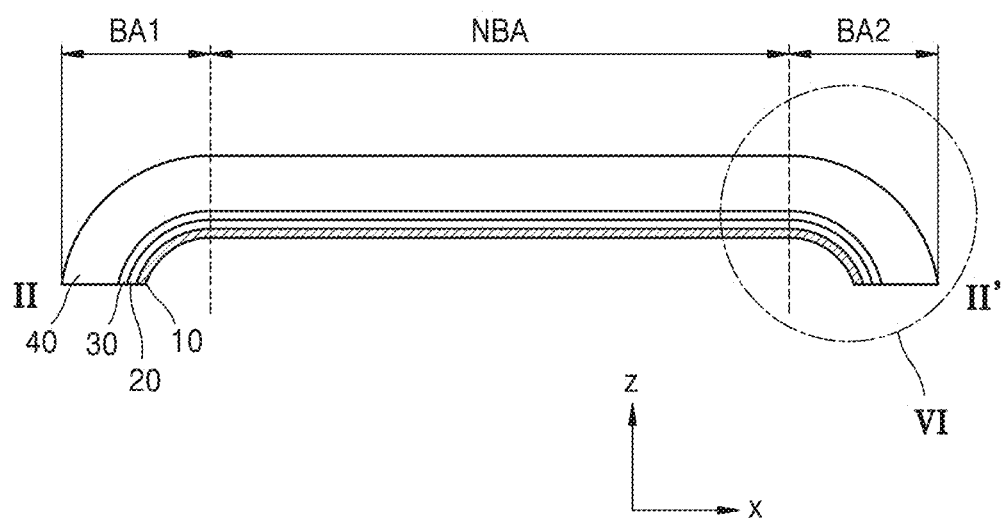
FIG. 2 is a schematic cross-sectional view taken along line II-II' of FIG. 1.
Figure 3:
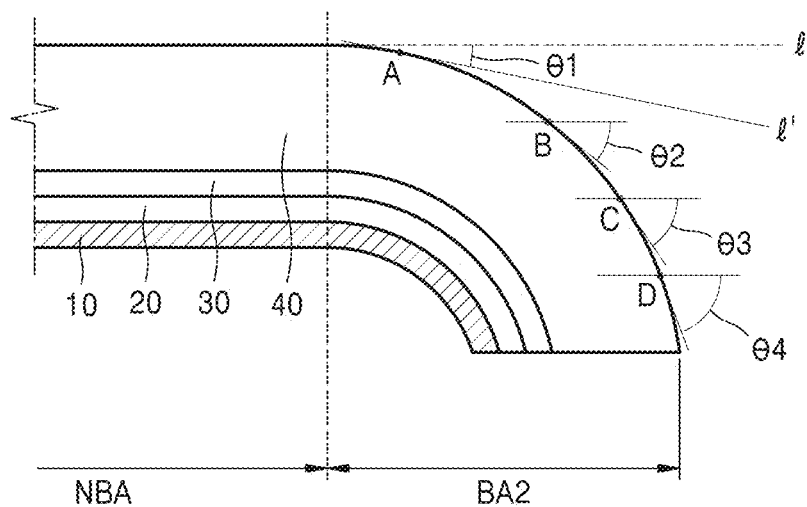
FIG. 3 is an enlarged view of portion IV of FIG. 2.

FIG. 2 is a schematic cross-sectional view taken along line II-II' of FIG. 1. FIG. 3 is an enlarged view of portion IV of FIG. 2.

Referring to FIG. 2, the display apparatus 1 may include a display panel 10, and an input sensing member 20 and an optical function member 30 arranged on the display panel 10, and the display panel 10, the input sensing member 20, and the optical function member 30 may be covered by a window 40. The display apparatus 1 may be various electronic devices such as a mobile phone, a notebook computer, or a smartwatch.

The display panel 10 may display an image. The display panel 10 includes pixels arranged in the display area DA. The pixels may include a display element and a pixel circuit connected thereto. According to an exemplary embodiment, the display element may include an organic light-emitting diode.

The input sensing member 20 obtains coordinate information according to an external input, for example, a touch event. The input sensing member 20 may include a sensing electrode (or touch electrode) and tracing lines connected to the sensing electrode. The input sensing member 20 may be arranged on the display panel 10.

The input sensing member 20 may be directly formed on the display panel 10 or may be separately formed and then be combined with the display panel 10 through an adhesive layer such as an optically clear adhesive (OCA). For example, the input sensing member 20 may be continuously formed after a process of forming the display panel 10, and in this case, no adhesive layer may be arranged between the input sensing member 20 and the display panel 10. FIG. 2 shows the input sensing member 20 arranged between the display panel 10 and the optical function member 30. However, according to another exemplary embodiment, the input sensing member 20 may be arranged on the optical function member 30.

The optical function member 30 may include an anti-reflection layer. The anti-reflection layer may decrease reflectance of light (external light) incident on the window 40 in a direction from the outside towards the display panel 10. The anti-reflection layer may include a phase retarder and a polarizer. The phase retarder may be a film type or a liquid crystal coating type and may include a λ/2 phase retarder and/or a λ/4 phase retarder. The polarizer may also be a film type or a liquid crystal coating type. The film type may include an elongation-type synthetic resin film, and the liquid crystal coating type may include liquid crystals arranged in a certain arrangement. The phase retarder and the polarizer may further include a protection film. The phase retarder and the polarizer themselves or the protection film may be defined as a base layer of the anti-reflection layer.

According to another exemplary embodiment, the anti-reflection layer may include a black matrix and color filters. The color filters may be arranged by taking into account a color of light emitted from each pixel of the display panel 10. According to another exemplary embodiment, the anti-reflection layer may include a destructive interference structure. The destructive interference structure may include a first reflection layer and a second reflection layer arranged on different layers from each other. First reflected light and second reflected light respectively reflected from the first reflection layer and the second reflection layer may be subject to destructive interference, and accordingly, external light reflectance may decrease.

The optical function member 30 may include a lens layer. The lens layer may increase light output efficiency of light emitted from the display panel 10 or may decrease color deviation. The lens layer may include a layer having a concave or convex lens shape and/or may include a plurality of layers having different refractive indexes from each other. The optical function member 30 may include both of the anti-reflection layer and the lens layer described above or may include either of the anti-reflection layer and the lens layer.

The window 40 may increase the mechanical strength of the display apparatus 1 and may protect the display panel 10 from an external shock. Also, the window 40 may maintain a curved shape of the display apparatus 1.

The window 40 may have a transmittance that facilitates transmission of a display screen of the display panel 10. The window 40 may include various materials. For example, the window 40 may include glass or plastic. In some exemplary embodiments, the window 40 may include glass or an optically transparent polymer. However, exemplary embodiments are not limited thereto, and the window 40 may include any material that allows a portion thereof to have a curved shape.

The window 40 may be formed through injection. However, exemplary embodiments are not limited thereto, and the first and second bending areas BA1 and BA2 having curved surfaces may be formed by bending both ends of the window 40 having a flat shape.

Referring to FIG. 3, a portion VI of the non-bending area NBA and the second bending area BA2 of FIG. 2 is enlarged.

The second bending area BA2 of the display apparatus 1 extends from the non-bending area NBA and is formed by bending. A boundary between the non-bending area NBA and the second bending area BA2 may be defined as a portion where angles θ1, θ2, θ3, and θ4 between an imaginary line l extending from the non-bending area NBA and a tangent l' of the second bending area BA2 start to be formed.

Referring to FIG. 3, the imaginary line l extending from the non-bending area NBA is parallel to an upper surface of the non-bending area NBA. Each of the points A, B, C, and D shown in FIG. 3 defined on the upper surface of the second bending area BA2 is increasingly spaced apart from the non-bending area NBA. Also, θ1, θ2, θ3, and θ4 refer to angles between the imaginary line l extending from the non-bending area NBA and the tangent l' at each of A, B, C and D points.

The angles θ1, θ2, θ3, and θ4 between the imaginary line l extending from the non-bending area NBA and the tangent l' of the second bending area BA2 increase as each of the points A, B, C, and D is increasingly spaced apart from the non-bending area NBA. θ4, which is an angle between the imaginary line l extending from the non-bending area NBA and the tangent l' at the point D, is greatest among θ1, θ2, θ3, and θ4 (θ1<θ2<θ3<θ4). a curvature of the second bending area BA2 may increase as a distance from the non-bending area NBA increases. While a description has been given based on the second bending area BA2, the first bending area BA1 may be symmetrical to the second bending area BA2 with respect to the non-bending area NBA so the first bending area BA1 have the same configuration as the second bending area BA2.

Figure 7:
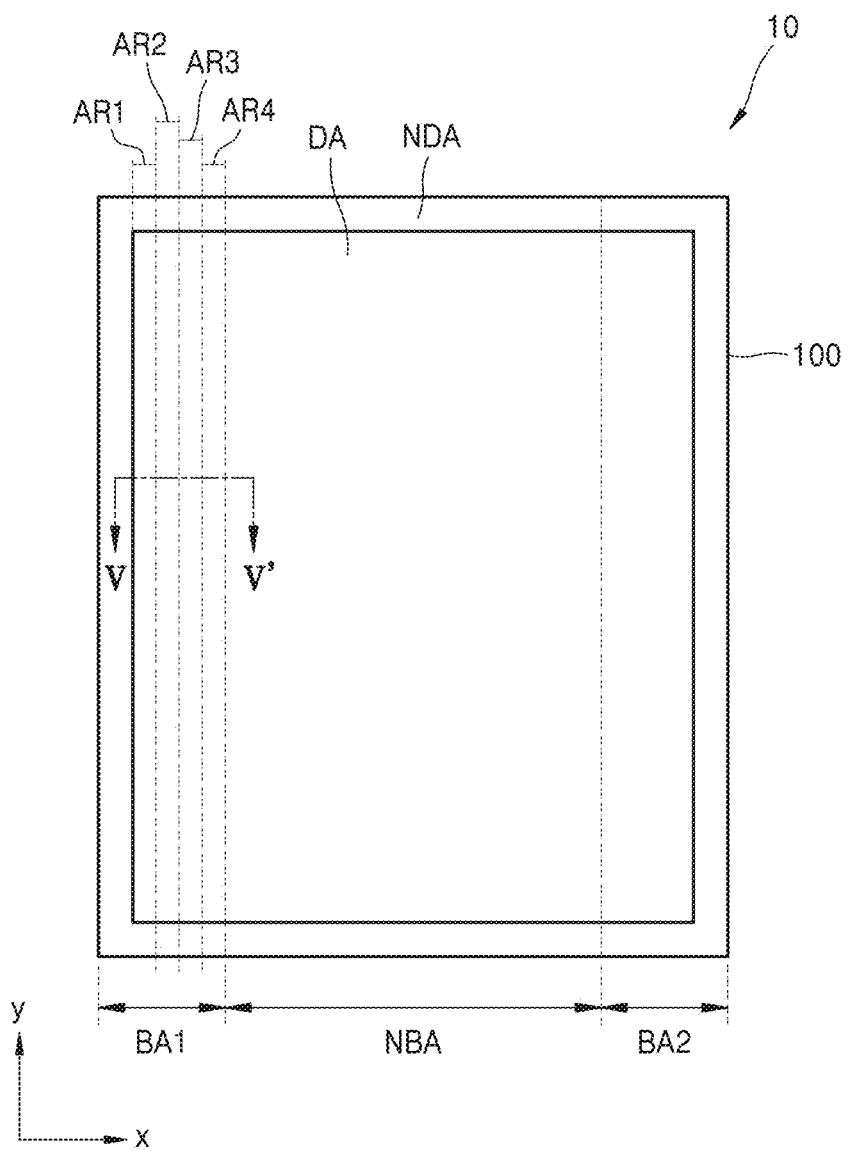
FIG. 7 is a plan view of the display panel of FIG. 5 illustrating a bending area having a plurality of curved areas.

Referring to FIG. 7, a portion of the first bending area BA1 corresponding to the display area DA is imaginarily divided into a first area AR1, a second area AR2, a third area AR3, and a fourth area AR4. In this regard, the point A may overlap a pixel of the fourth area AR4, and the point B may overlap a pixel of the third area AR3. Also, the point C may overlap a pixel of the second area AR2, and the point D may overlap a pixel of the first area AR1.

Figure 4:
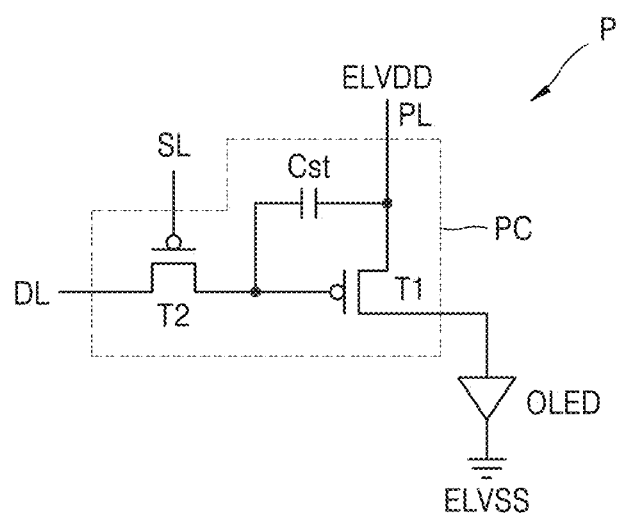
FIG. 4 is an equivalent circuit diagram of an exemplary embodiment of a representative pixel of the display panel of FIG. 2.

FIG. 4 is an equivalent circuit diagram of an exemplary embodiment of a representative pixel of the display panel of FIG. 2.

Referring to FIG. 4, each pixel P includes the pixel circuit PC and a display element connected to the pixel circuit PC. The display element may be in the form of an organic light-emitting diode OLED. The pixel circuit PC may include a driving thin film transistor (TFT) T1, a switching TFT T2, and a storage capacitor Cst. Each pixel P may emit, for example, red (R), green (G), blue (B), or white (W) light, through the organic light-emitting diode OLED.

The switching TFT T2 may be connected to a scan line SL and a data line DL and may be configured to transmit a data voltage input from the data line DL to the driving TFT T1 according to a switching voltage input from the scan line SL. The storage capacitor Cst may be connected to the switching TFT T2 and a driving voltage line PL and may store a voltage corresponding to a difference between a voltage received from the switching TFT T2 and a first power voltage ELVDD supplied to the driving voltage line PL.

The driving TFT T1 may be connected to the driving voltage line PL and the storage capacitor Cst and may control a driving current flowing through the organic light-emitting diode OLED from the driving voltage line PL in response to a voltage value stored in the storage capacitor Cst. The organic light-emitting diode OLED may emit light having brightness according to the driving current. An opposite electrode (for example, a cathode) of the organic light-emitting diode OLED may receive a second power voltage ELVSS.

While FIG. 4 shows the pixel circuit PC including two TFTs and one storage capacitor, exemplary embodiments are not limited thereto. The number of TFTs and the number of storage capacitors may be variously changed according to design of the pixel circuit PC.

Figure 5:
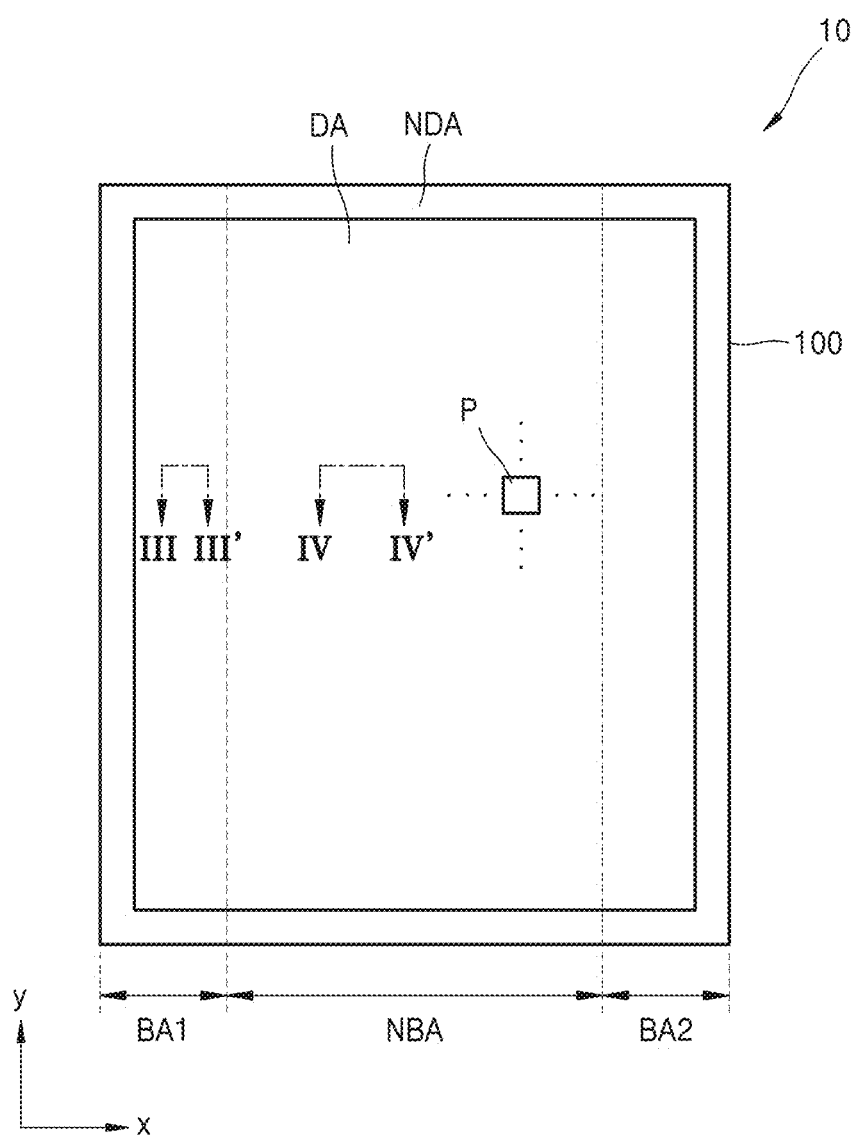
FIG. 5 is a plan view of an exemplary embodiment of the display panel of FIG. 2.
Figure 6:
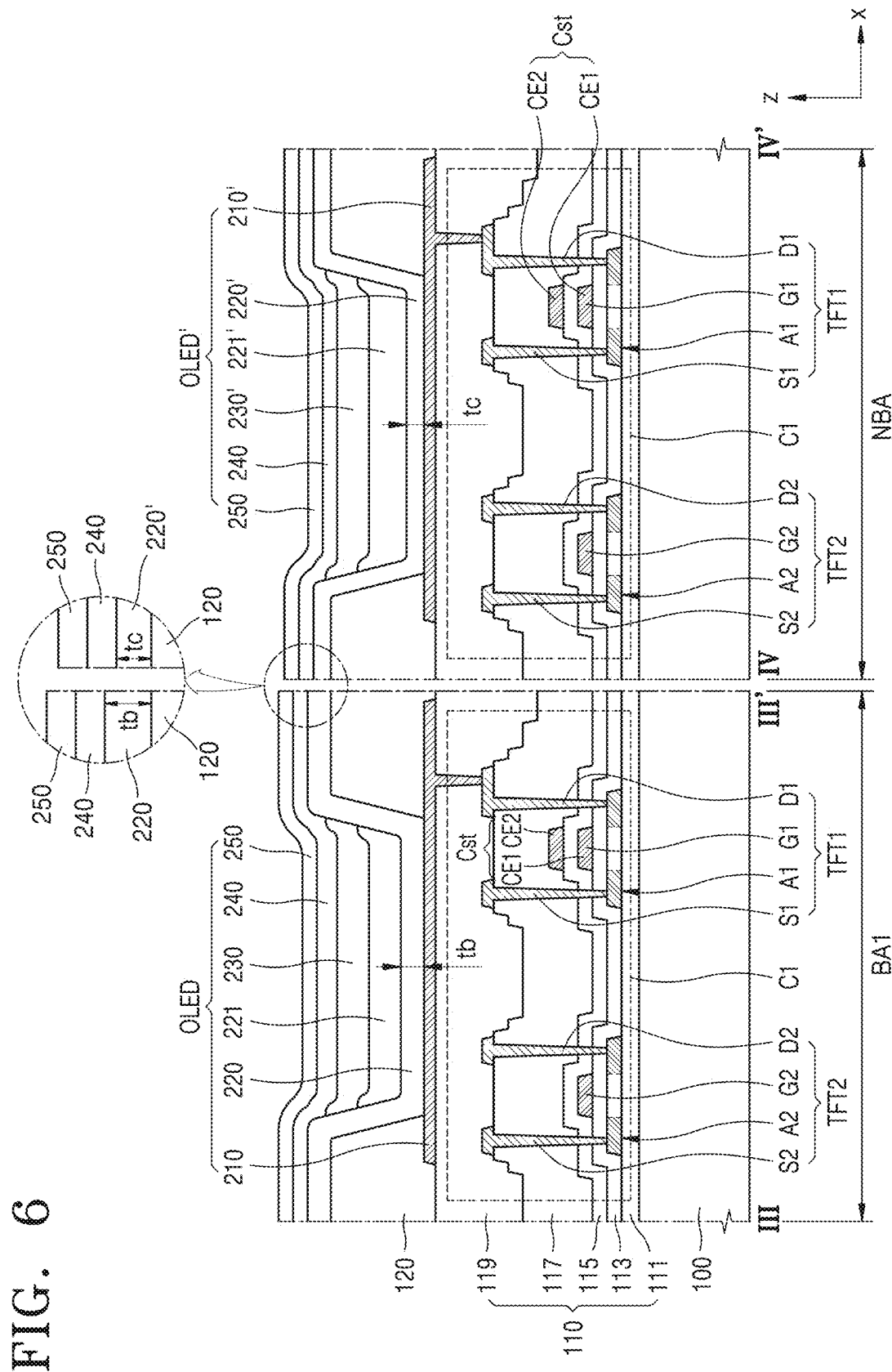
FIG. 6 is a schematic cross-sectional view taken along line and line IV-IV' of FIG. 5 illustrating an exemplary embodiment of the display panel.

FIG. 5 is a plan view of an exemplary embodiment of the display panel of FIG. 2. FIG. 6 is a schematic cross-sectional view taken along line and line IV-IV' of FIG. 5 illustrating an exemplary embodiment of the display panel.

Referring to FIG. 5, the display panel 10 includes the display area DA and the non-display area NDA. FIG. 5 may be understood as the shape of a substrate 100 of the display panel 10. For example, the substrate 100 may be understood as having the display area DA and the non-display area NDA. Also, the display panel 10 includes the plurality of pixels P arranged in the display area DA.

The first and second bending areas BA1 and BA2 may be located on edges of the substrate 100. The substrate 100 may have the non-bending area NBA, the first bending area BA1 on one side of the non-bending area NBA partially including the non-display area NDA and the display area DA, and the second bending area BA2 on the other side of the non-bending area NBA partially including the non-display area NDA and the display area DA. While FIG. 5 shows the first bending area BA1 and the second bending area BA2 provided on one side and the other side of the substrate 100, exemplary embodiments are not limited thereto. According to another exemplary embodiment, either of the first bending area BA1 and the second bending area BA2 may be provided. According to another exemplary embodiment, it is sufficient for any portion of the substrate 100 to have a bending area.

Referring to FIG. 6, a cross-section taken along line of FIG. 5 shows a portion in the first bending area BA1, and a cross-section taken along line IV-IV' shows a portion in the non-bending area NBA.

The display apparatus 1 includes the non-bending area NBA and the first and second bending areas BA1 and BA2 extending from the non-bending area NBA, and a first pixel electrode 210 is arranged in the first and second bending areas BA1 and BA2, and a second pixel electrode 210' is arranged in the non-bending area NBA. A first emission layer 230 corresponds to the first pixel electrode 210, and a second emission layer 230' corresponds to the second pixel electrode 210'. Also, a first functional layer 220 is arranged between the first pixel electrode 210 and the first emission layer 230, and a second functional layer 220' is arranged between the second pixel electrode 210' and the second emission layer 230'. In this regard, the thickness tb of the first functional layer 220 may be greater than the thickness tc of the second functional layer 220'.

Hereinafter, components included in the display apparatus 1 will be described in more detail according to a stacked sequence with reference to FIG. 6.

The substrate 100 may include glass, ceramic, metal, or a flexible or bendable material. When the substrate 100 is flexible or bendable, the substrate 100 may include polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single-layer or multilayer structure of the material described above, and in the case of a multilayer structure, may further include an inorganic layer. In some exemplary embodiments, the substrate 100 may have a structure of an organic material/an inorganic material/an organic material.

A barrier layer may be further included between the substrate 100 and a buffer layer 111. The barrier layer may prevent or reduce penetration of impurities from the substrate 100 into semiconductor layers A1 and A2. The barrier layer may include an inorganic material such as oxide or nitride, an organic material, or an organic-inorganic complex material and may have a single-layer or multilayer structure of an inorganic material and an organic material.

The semiconductor layers A1 and A2 may be arranged on the buffer layer 111. The semiconductor layers A1 and A2 may include amorphous silicon or polysilicon. According to another exemplary embodiment, the semiconductor layers A1 and A2 may include oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The semiconductor layers A1 and A2 each may include a channel region, and a source region and a drain region arranged at both sides of the channel region. The semiconductor layers A1 and A2 may have a single-layer or multilayer structure.

A first gate insulating layer 113 and a second gate insulating layer 115 may be stacked over the substrate 100 to cover the semiconductor layers A1 and A2. The first gate insulating layer 113 and the second gate insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

First and second gate electrodes G1 and G2 may be arranged on the first gate insulating layer 113 to at least partially overlap the semiconductor layers A1 and A2. FIG. 6 shows the first and second gate electrodes G1 and G2 arranged on the first gate insulating layer 113. However, according to another exemplary embodiment, the first and second gate electrodes G1 and G2 may be arranged on an upper surface of the second gate insulating layer 115. Also, the first and second gate electrodes G1 and G2 may be arranged on the same layer or may be arranged on different layers.

According to an exemplary embodiment, the storage capacitor Cst may include a lower electrode CE1 and an upper electrode CE2 and may overlap a first TFT TFT1 as shown in FIG. 6. For example, the first gate electrode G1 of the first TFT TFT1 may serve as the lower electrode CE1 of the storage capacitor Cst. Unlike this, the storage capacitor Cst may not overlap the first TFT TFT1 but may be present separately.

The upper electrode CE2 of the storage capacitor Cst overlaps the lower electrode CE1 with the second gate insulating layer 115 therebetween and forms capacitance. In this case, the second gate insulating layer 115 may serve as a dielectric layer of the storage capacitor Cst.

An interlayer insulating layer 117 may be provided on the second gate insulating layer 115 to cover the upper electrode CE2 of the storage capacitor Cst. The interlayer insulating layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

Source electrodes S1 and S2, drain electrodes D1 and D2, and the data line DL shown in FIG. 4 may be arranged on the interlayer insulating layer 117.

The source electrodes S1 and S2, the drain electrodes D1 and D2, and the data line DL may include a conductive material including molybdenum (Mo), aluminum (Al), copper (Cu), titanium (Ti), etc. and may have a multilayer or single-layer structure including the material described above. For example, the source electrodes S1 and S2, the drain electrodes D1 and D2, and the data line DL may have a multilayer structure of Ti/Al/Ti. The source electrodes S1 and S2 and the drain electrodes D1 and D2 may be connected to source or drain regions of the semiconductor layers A1 and A2 via contact holes.

The source electrodes S1 and S2 and the drain electrodes D1 and D2 may be covered by an inorganic protective layer. The inorganic protective layer may be a single film or a multilayer film of silicon nitride ($SiN_x$) and silicon oxide ($SiO_x$). The inorganic protective layer may be introduced to cover and protect some wires arranged on the interlayer insulating layer 117.

A planarization layer 119 may cover the source electrodes S1 and S2 and the drain electrodes D1 and D2, and organic light-emitting diodes OLED and OLED' may be arranged on the planarization layer 119.

The planarization layer 119 may include a film including an organic material in a single-layer or multilayer structure and may provide a flat upper surface. The planarization layer 119 may include a general commercial polymer such as benzocyclobutene (BCB), polyimide, hexamethyldisiloxane (HMDSO), poly(methyl methacrylate) (PMMA), or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The buffer layer 111, the first gate insulating layer 113, the second gate insulating layer 115, the interlayer insulating layer 117, and the planarization layer 119 where first and second TFTs TFT1 and TFT2 are located are collectively referred to as a circuit layer 110. Also, the first TFT TFT1, the second TFT TFT2, and the storage capacitor Cst are collectively defined as a first circuit portion C1.

The organic light-emitting diodes OLED and OLED' are arranged on the planarization layer 119. The organic light-emitting diodes OLED and OLED' include the first and second pixel electrodes 210 and 210', the first and second functional layers 220 and 220', first and second auxiliary layers 221 and 221', the first and second emission layers 230 and 230', an upper functional layer 240, and an opposite electrode 250.

The first and second pixel electrodes 210 and 210' may be (semi)light-transmissive electrodes or reflective electrodes. In some exemplary embodiments, the first and second pixel electrodes 210 and 210' may include a reflective layer including silver (Ag), magnesium (Mg), aluminum (Al), platinum (Pt), palladium (Pd), gold (Au), nickel (Ni), neodymium (Nd), iridium (Ir), chromium (Cr), and a compound thereof, and a transparent or semi-transparent electrode layer on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some exemplary embodiments, the first and second pixel electrodes 210 and 210' may include ITO/Ag/ITO.

A pixel-defining layer 120 may be arranged on the planarization layer 119. Also, the pixel-defining layer 120 may prevent the occurrence of an arc at edges of the first and second pixel electrodes 210 and 210' by increasing a distance between the edge of the first and second pixel electrodes 210 and 210' and the opposite electrode 250 arranged over the first and second pixel electrodes 210 and 210'.

The pixel-defining layer 120 may be formed by a method such as spin coating, using one or more organic insulating materials selected from the group consisting of polyimide, polyamide, acrylic resin, BCB, and phenolic resin.

The first functional layer 220 and the second functional layer 220' may be arranged over the display area DA and may be disposed on the pixel-defining layer 120 and the first and second pixel electrodes 210 and 210'. The first functional layer 220 and the second functional layer 220' may have a single-layer or multilayer structure. For example, when the first functional layer 220 and the second functional layer 220' include a polymer material, each of the first functional layer 220 and the second functional layer 220' may include a hole transport layer (HTL) having a single-layer structure, which includes poly-(3,4)-ethylene-dihydroxy thiophene (PEDOT) or polyaniline (PANT). When the first functional layer 220 and the second functional layer 220' include a low molecular weight material, each of the first functional layer 220 and the second functional layer 220' may include a hole injection layer (HIL) and an HTL.

FIG. 6 shows respective pixel structures of the first bending area BA1 and the non-bending area NBA. The first functional layer 220 and the second functional layer 220' may be continuously formed in one or more processes to be integral with each other.

The first auxiliary layer 221 and the second auxiliary layer 221' may be arranged on the first functional layer 220 and the second functional layer 220', respectively, to correspond to the first pixel electrode 210 and the second pixel electrode 210'. The auxiliary layers 221 and 221' can select (or adjust) the distance between the pixel electrodes 210 and 210' and the opposite electrode 250. For example, if the thickness of the auxiliary layers 221 and 221' is thin, the distance between the pixel electrodes 210 and 210' and the opposite electrode 250 may be reduced. The organic light-emitting diode OLED emits light of amplified specific wavelength and the amplified specific wavelength varies depending on the distance between the pixel electrodes 210 and 210' and the opposite electrode 250. That is, a wavelength band in which constructive interference occurs is determined by the distance between the pixel electrodes 210 and 210' and the opposite electrode 250, and the organic light-emitting diode OLED may emit light of the amplified specific wavelength. As such, the auxiliary layers 221 and 221' may control the amplified specific wavelength by the organic light-emitting diode OLED by adjusting the distance between the pixel electrodes 210 and 210' and the opposite electrode 250. Further, the auxiliary layers 221 and 221' may be the HTL.

The first emission layer 230 and the second emission layer 230' may be arranged on the first auxiliary layer 221 and the second auxiliary layer 221', respectively. The first and second emission layers 230 and 230' may include an organic material including a fluorescent or phosphorescent material emitting red, green, blue, or white light. The first and second emission layers 230 and 230' may include a low molecular weight organic material or a polymer organic material.

The upper functional layer 240 may be arranged over the display area DA and may be arranged on the first and second functional layers 220 and 220' and the first and second emission layers 230 and 230'. The upper functional layer 240 may be omitted. For example, when the first and second functional layers 220 and 220' and the first and second emission layers 230 and 230' include a polymer material, the upper functional layer 240 may be formed to make characteristics of the organic light-emitting diodes OLED and OLED' excellent. The upper functional layer 240 may have a single-layer or multilayer structure. The upper functional layer 240 may include an electron transport layer (ETL) and/or an electron injection layer (EIL).

The opposite electrode 250 may be a light-transmissive electrode or a reflective electrode. In some exemplary embodiments, the opposite electrode 250 may be a transparent or semi-transparent electrode and may include a metal thin film having a low work function and including Li, Ca, LiF/Ca, LiF/Al, Al, Ag, Mg, and a compound thereof. Also, a transparent conductive oxide (TCO) film such as ITO, IZO, ZnO, or $In_2O_3$ may be further arranged on the metal thin film. The opposite electrode 250 may be arranged over the display area DA and may be arranged over the first and second functional layers 220 and 220' and the first and second emission layers 230 and 230'. The opposite electrode 250 may be integrally formed in the display area DA to correspond to the first and second pixel electrodes.

A capping layer may be arranged on the opposite electrode 250. The capping layer may be configured to protect the opposite electrode 250 and may be configured to increase light extraction efficiency. For example, the capping layer may include a material having a refractive index of 1.2 to 3.1. Also, the capping layer may include an organic material. However, the capping layer may be removed.

Referring to the enlarged view of FIG. 6, the thickness tb of the first functional layer 220 arranged in the first bending area BA1 may be greater than the thickness tc of the second functional layer 220' arranged in the non-bending area NBA. While the enlarged view shows the thickness tb and the thickness tc of the first functional layer 220 and the second functional layer 220' located on the pixel-defining layer 120, the thickness tb of the first functional layer 220 may be the same as even on the first pixel electrode 210, and the thickness tc of the second functional layer 220' may be also constant anywhere in the non-bending area NBA.

According to an exemplary embodiment, the thickness tc of the second functional layer 220' may be about 1150 Å, and the thickness tb of the first functional layer 220 may be greater than about 1150 Å and less than about 1730 Å. This is because when the thickness tb of the first functional layer 220 is greater than 1730 about Å, an unintended process change is caused, and sufficient adjustment may be made within 1730 about Å in terms of a difference between the color in the bending area BA and the color in the non-bending area NBA. Specifically, the thickness tb of the first functional layer 220 for matching (or compensating) the difference between the color sense entering the visual field in the bending area BA and the color sense entering the visual field in the non-bending area NBA may be about 1150 Å to 1730 Å. A more detailed description thereof is given below with reference to FIG. 11.

Figure 11:
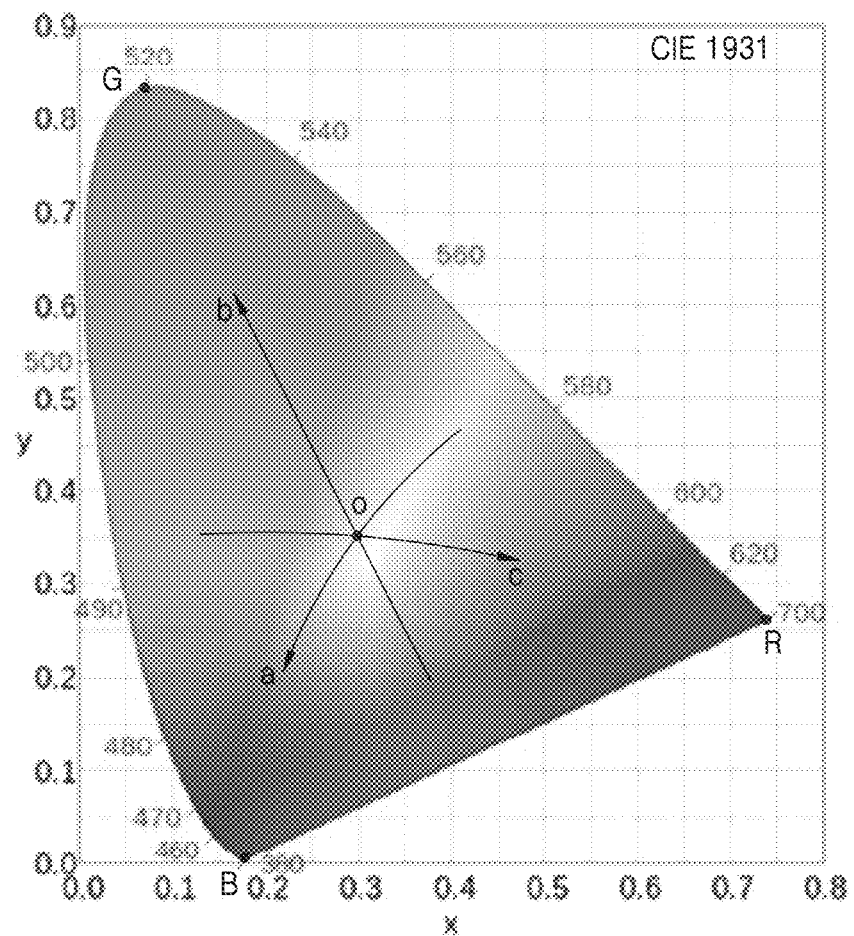
FIG. 11 is a graph of chromaticity.

FIG. 11 is a graph of chromaticity.

Referring to FIG. 11, the color scheme 'CIE 1931' released in 1931 by the International Commission on Illumination (CIE), which governs light, illumination, color, and color spaces, represents an area of visible light visible to the human eye.

If a functional layer disposed below an emission layer arranged in a bending area has a thickness the same as that of a functional layer disposed below an emission layer arranged in a non-bending area, the viewing angle of the bending area may be different from that of the non-bending area depending on the refractive index, which causes the color perceived in the bending area to be different from the color perceived in the non-bending area. For example, in the non-bending area, white W obtained by uniformly combining red R, green G, and blue B may be perceived, whereas, in the bending area, concentrations of the red R and the green G are increased and this may cause yellow Y to be perceived instead of white. Referring to FIG. 11, the yellow Y is displayed due to a bias in a direction −a.

The specific wavelength amplified in the organic light emitting diode OLED may be determined by the distance between the pixel electrode and the opposite electrode. In the non-bending area, a first wavelength may be amplified by the distance between the pixel electrode and the opposite electrode. However, since a variable, referred to as a viewing angle, is affected in the bending area, a second wavelength may be amplified by the distance between the pixel electrode and the opposite electrode, the distance being shorter than in the non-bending area by the viewing angle. As such, specific wavelengths amplified for the non-bending area and the bending area are different. As a result, the luminances of the red, green, and blue colors are different, and the luminance ratios of the red, green, and blue colors are different in the non-bending area and the bending area, so that the color senses entering the visual field are different. For example, a specific wavelength amplified in an organic light emitting diode OLED emitting red light corresponds to a red wavelength band, and a red luminance increases, and a specific wavelength amplified in an organic light emitting diode OLED emitting green light corresponds to a green wavelength band, and a green luminance increases. However, a specific wavelength amplified in the organic light emitting diode OLED emitting blue light does not correspond to a blue wavelength band, so the blue luminance may decrease. That is, the luminance of blue in the bending area may be relatively reduced compared to that of red and green, and the color sense entering the field of view may be yellow.

Unlike this case, in the illustrated exemplary embodiment, the thickness tb of the first functional layer 220 arranged in the first bending area BA1 is greater than the thickness tc of the second functional layer 220' arranged in the non-bending area NBA, the viewing angle of the first bending area BA1 may be adjusted to move the yellow Y resulting from a bias in the direction −a in FIG. 11 back in a direction +a and be located at an origin O, thereby displaying the intact white W. That is, the white W may be perceived instead of the yellow Y in the first bending area BA1, and the difference in the perceived colors between the first bending area BA1 and the non-bending area NBA may be improved and/or reduced. While a description has been given based on the first bending area BA1, the second bending area BA2 may be configured the same as the first bending area BA1.

When the thickness of the first functional layer 220 disposed in the bending area BA is adjusted, the distance between the pixel electrode 210, and the opposite electrode 250 in the bending area BA can be controlled. Through this, since a specific wavelength amplified in the organic light emitting diode OLED disposed in the bending area BA can be controlled, the luminance ratio of red, green, and blue in the bending area BA can be adjusted. Therefore, since the luminance ratio of red, green, and blue can be adjusted to be closer to 1:1:1, the color sense entering the field of view in the bending area BA may be white.

Figure 8A:
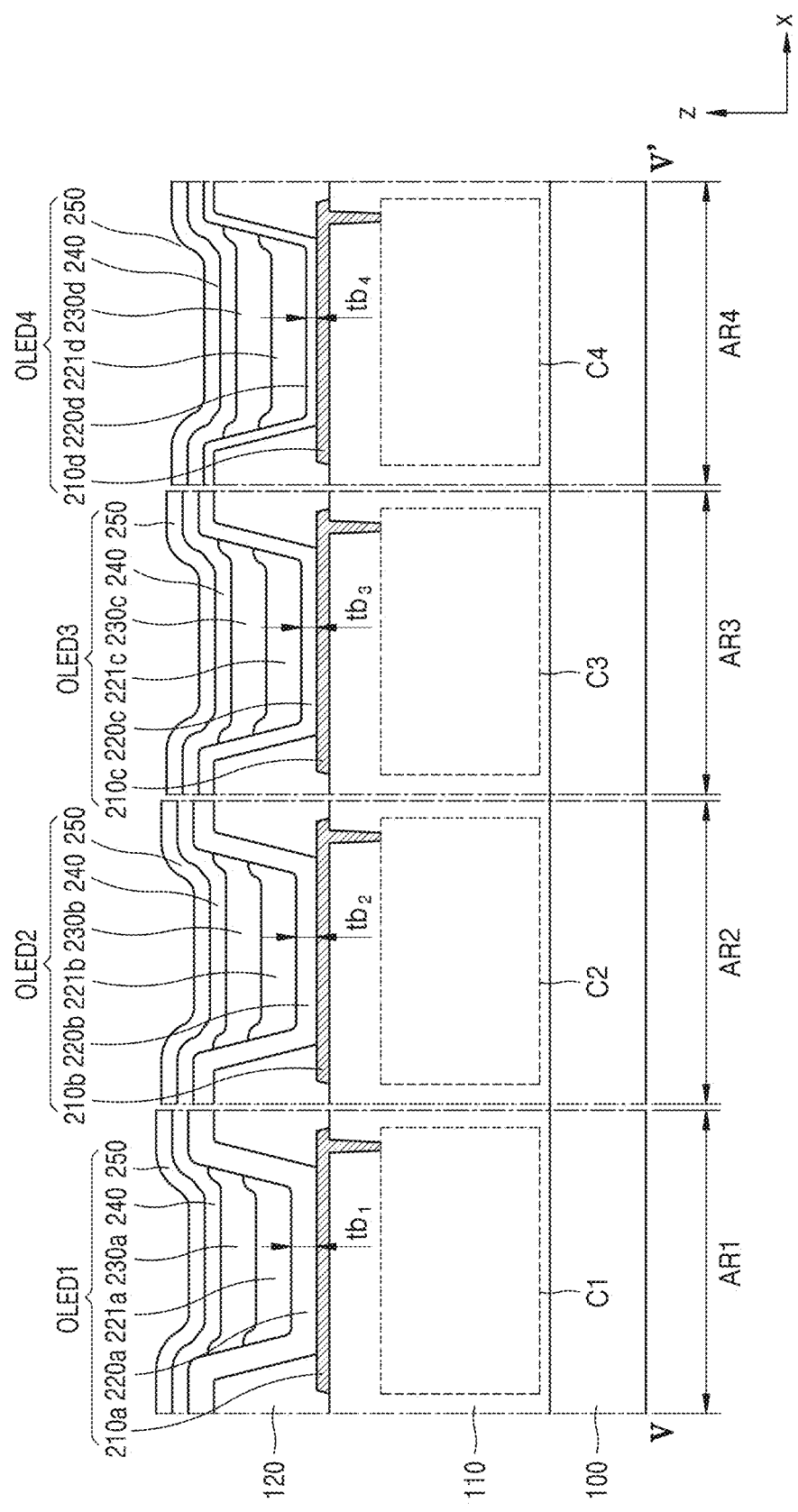
FIG. 8A is a schematic cross-sectional view taken along line V-V of FIG. 7 illustrating another exemplary embodiment of the display panel.
Figure 8B:
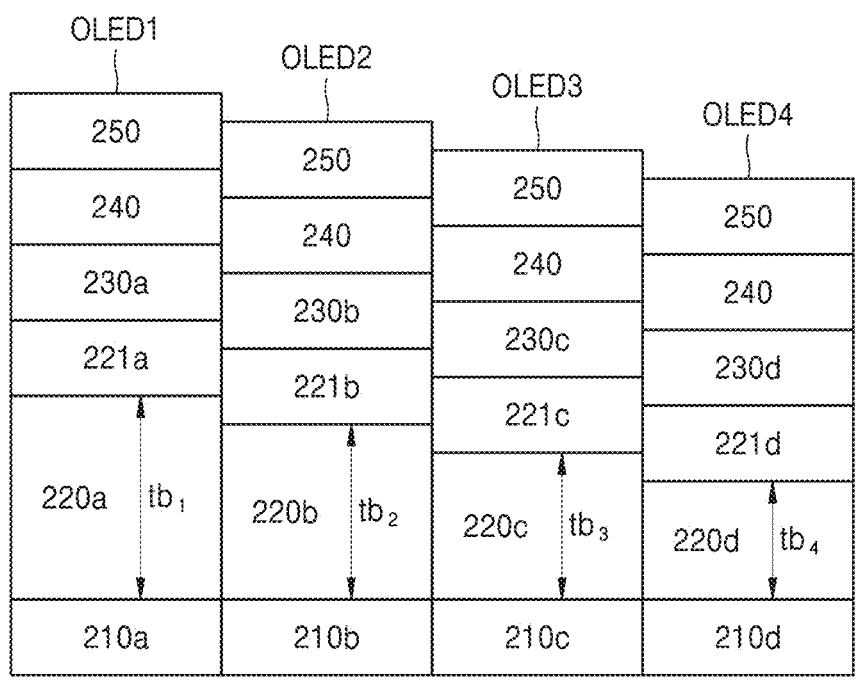
FIG. 8B is a diagram schematically illustrating a thickness comparison of certain layers of the display elements of FIG. 8A.

FIG. 7 is a plan view of the display panel of FIG. 5 illustrating a bending area having a plurality of curved areas. FIG. 8A is a schematic cross-sectional view taken along line V-V of FIG. 7 illustrating another exemplary embodiment of the display panel. FIG. 8B is a diagram schematically illustrating a thickness comparison of certain layers of the display elements of FIG. 8A. In FIGS. 7 and 8A, the same reference numerals as those in FIGS. 5 and 6 denote the same elements, and thus, repeated description thereof will be omitted for conciseness.

Referring to FIG. 7, the display panel 10 includes the display area DA and the non-display area NDA and includes the plurality of pixels P arranged in the display area DA. Also, the substrate 100 may have the non-bending area NBA, the first bending area BA1 on one side of the non-bending area NBA partially including the non-display area NDA and the display area DA, and the second bending area BA2 on the other side of the non-bending area NBA partially including the non-display area NDA and the display area DA.

The first area AR1, the second area AR2, the third area AR3, and the fourth area AR4 are obtained by imaginarily dividing a portion of the first bending area BA1 corresponding to the display area DA into four. The first area AR1 is furthest from the non-bending area NBA, and the fourth area AR4 is closest to the non-bending area NBA.

Referring back to FIG. 3, the first area AR1 includes the point D where an angle between the imaginary line l extending from the non-bending area NBA and the tangent l' of any one of the first and second bending areas BA1 and BA2 is θ4, and the second area AR2 includes the point C where the angle is θ3. Also, the third area AR3 includes the point B where the angle is θ2, and the fourth area AR4 includes the point A where the angle is ∂1.

Dividing the portion of the first bending area BA1 corresponding to the display area DA into four is merely for convenience to describe an exemplary embodiment in FIG. 8A.

FIG. 8A shows respective cross-sections of the first area AR1, the second area AR2, the third area AR3, and the fourth area AR4 of FIG. 7.

Referring to FIG. 8A, the circuit layer 110 may be arranged on the substrate 100, and first to fourth circuit portions C1, C2, C3, and C4 are included and/or disposed in the circuit layer 110.

A first pixel electrode 210a, a second pixel electrode 210b, a third pixel electrode 210c, and a fourth pixel electrode 210d are connected to the first circuit portion C1, the second circuit portion C2, the third circuit portion C3, and the fourth circuit portion C4, respectively. Also, the pixel-defining layer 120 is arranged on the first to fourth pixel electrodes 210a to 210d to cover edges of the first to fourth pixel electrodes 210a to 210d and partially expose the first to fourth pixel electrodes 210a to 210d.

A first display element OLED1 includes the first pixel electrode 210a, a first functional layer 220a covering the pixel-defining layer 120 and the first pixel electrode 210a, a first auxiliary layer 221a arranged on the first functional layer 220a and corresponding to the first pixel electrode 210a, a first emission layer 230a arranged on the first auxiliary layer 221a, the upper functional layer 240 arranged on the first emission layer 230a, and the opposite electrode 250 arranged on the upper functional layer 240.

A second display element OLED2 includes the second pixel electrode 210b, a second functional layer 220b, a second auxiliary layer 221b, a second emission layer 230b, the upper functional layer 240, and the opposite electrode 250. A third display element OLED3 includes the third pixel electrode 210c, a third functional layer 220c, a third auxiliary layer 221c, a third emission layer 230c, the upper functional layer 240, and the opposite electrode 250. Also, a fourth display element OLED4 includes the fourth pixel electrode 210d, a fourth functional layer 220d, a fourth auxiliary layer 221d, a fourth emission layer 230d, the upper functional layer 240, and the opposite electrode 250.

FIG. 8A shows respective pixel structures of the first area AR1, the second area AR2, the third area AR3, and the fourth area AR4. The first functional layer 220a, the second functional layer 220b, the third functional layer 220c, and the fourth functional layer 220d may be continuously formed in one or more processes to be integral with one another.

According to an exemplary embodiment, respective thicknesses $tb_1$, $tb_2$, $tb_3$, and $tb_4$ of the first to fourth functional layers 220a, 220b, 220c, and 220d may change and/or determined according to the angles θ4, θ3, θ2, and θ1 shown in FIG. 3 between the imaginary line I extending from the non-bending area NBA and the tangent l' of any one of the first and second bending areas BA1 and BA2 where the first to fourth display elements OLED1 to OLED4 overlaps.

According to another exemplary embodiment, as the angles θ4, θ3, θ2, and θ1 between the imaginary line I extending from the non-bending area NBA and the tangent l' of the first and second bending areas BA1 and BA2 increase, respective thicknesses $tb_1$, $tb_2$, $tb_3$, and $tb_4$ of the first to fourth functional layers 220a, 220b, 220c, and 220d may increase. A detailed description thereof is given below with reference to FIGS. 8B and 11.

FIG. 8B shows layers of each of the first to fourth display elements OLED1 to OLED4.

Referring to FIG. 8B, the thickness $tb_1$ of the first functional layer 220a is greatest, and sequential decrease occurs in order of the thickness $tb_2$ of the second functional layer 220b, the thickness $tb_3$ of the third functional layer 220c, and the thickness $tb_4$ of the fourth functional layer 220d. In this regard, respective thicknesses $tb_1$, $tb_2$, $tb_3$, and $tb_4$ of the first to fourth functional layers 220a, 220b, 220c, and 220d may decrease stepwise in each of the first to fourth areas AR1, AR2, AR3, and AR4 or may gradually decrease without distinction of areas.

More specifically, as the curvature of the first and second bending areas BA1 and BA2 increases, the angles θ1, θ2, θ3, and θ4 between the imaginary line I extending from the non-bending area NBA and the tangent I' of the first and second bending areas BA1 and BA2 increase (θ1<θ2<θ3<θ4), and the thicknesses $tb_4$, $tb_3$, $tb_2$, and $tb_1$ may also increase sequentially according to the amount by which the angles θ1, θ2, θ3, and θ4 increase.

If the thickness of a functional layer may be the same throughout a bending area, a viewing angle of each point of the bending area may vary depending on the refractive index, and thus, a difference in perceived color may occur at points of the bending area the bending area. As a curvature of the bending area increases, the viewing angle of each point of the bending area increases compared to a non-bending area, and this may cause a color perceived from a point of the bending area to be different from a color perceived in another point of the bending area. For example, concentrations of the red R and the green G may increase as the distance from the non-bending area increases, and accordingly the yellow Y may be clearly perceived in the bending area furthest from the non-bending area. Referring to FIG. 11, as a curvature of the bending area and/or the angle between the imaginary line I and the tangent I' increases, the yellow Y becomes clearer at the corresponding point of the bending area due to a bias in the direction −a.

Unlike this case, in the illustrated exemplary embodiment, the thicknesses $tb_4$, $tb_3$, $tb_2$, and $tb_1$ may be differentially formed according to at the amount by which the angles θ1, θ2, θ3, and θ4 between the imaginary line I extending from the non-bending area NBA and the tangent I' of the first and second bending areas BA1 and BA2 increase. In this case, the viewing angle of each of the first area AR1, the second area AR2, the third area AR3, and the fourth area AR4 may be adjusted to move the yellow Y resulting from a bias in the direction −a in FIG. 11 back in the direction +a and be located at the origin O displaying the intact white W. That is, the white W may be perceived instead of the yellow Y in the first bending area BA1, and the difference in the perceived colors between the first bending area BA and the non-bending area NBA and between the first to fourth areas AR1 to AR4 may be improved and/or reduced. While a description has been given based on the first bending area BA1, the second bending area BA2 may be configured the same as the first bending area BA1.

According to an exemplary embodiment, the thicknesses $tb_1$, $tb_2$, $tb_3$, and $tb_4$ of the first to fourth functional layers 220a, 220b, 220c, and 220d may be differentially formed in a range of about 1150 Å to about 1730 Å. When the thicknesses $tb_1$, $tb_2$, $tb_3$, and $tb_4$ of the first to fourth functional layers 220a, 220b, 220c, and 220d are greater than about 1730 Å, an unintended process change is caused, and sufficient adjustment may be made within about 1730 Å in terms of a length of color.

Figure 9A:
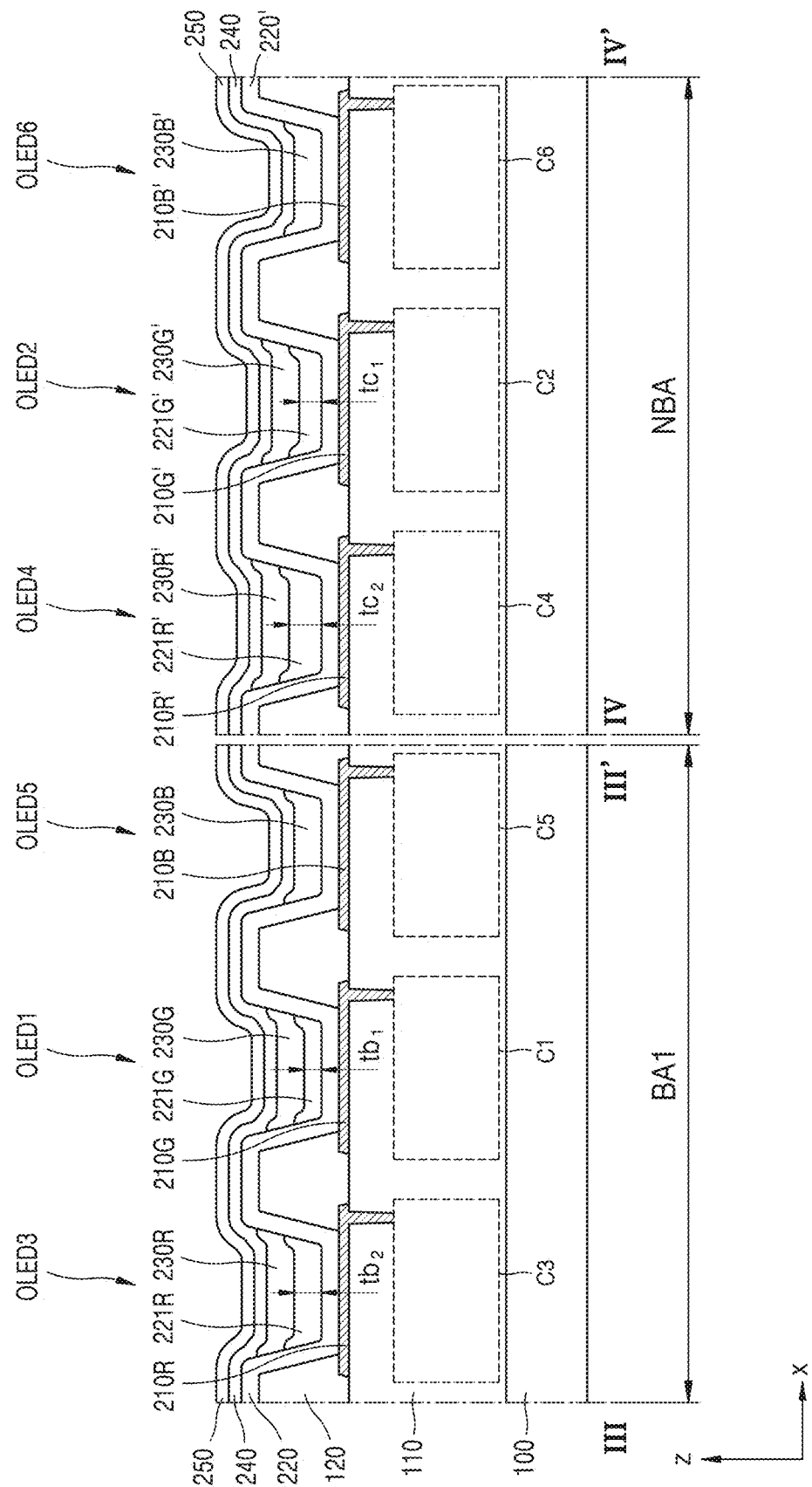
FIG. 9A is a schematic cross-sectional view taken along line and line IV-IV' of FIG. 5 illustrating still another exemplary embodiment of the display panel.
Figure 9B:
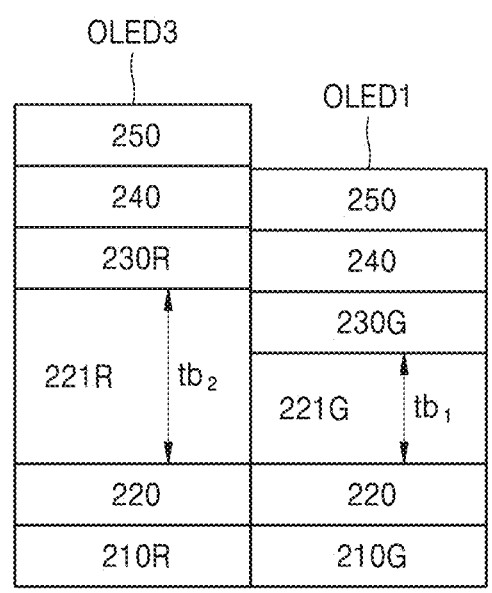
FIG. 9B is a diagram schematically illustrating a thickness comparison of layers of some of the display elements of FIG. 9A that emit light of colors different from each other.
Figure 9C:
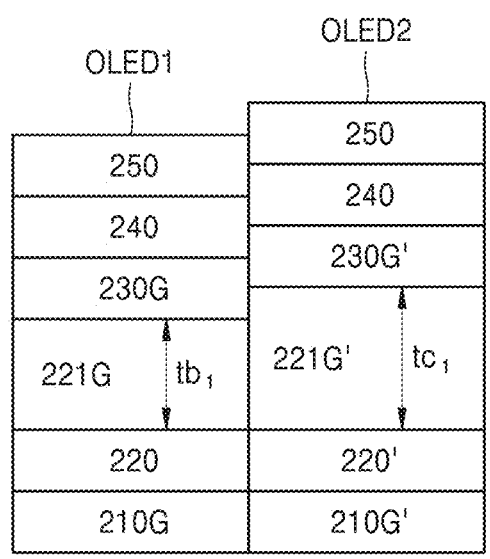
FIG. 9C is a diagram schematically illustrating a thickness comparison of layers of some of the display elements of FIG. 9A that are disposed in a bending area and a non-bending area.
Figure 9D:
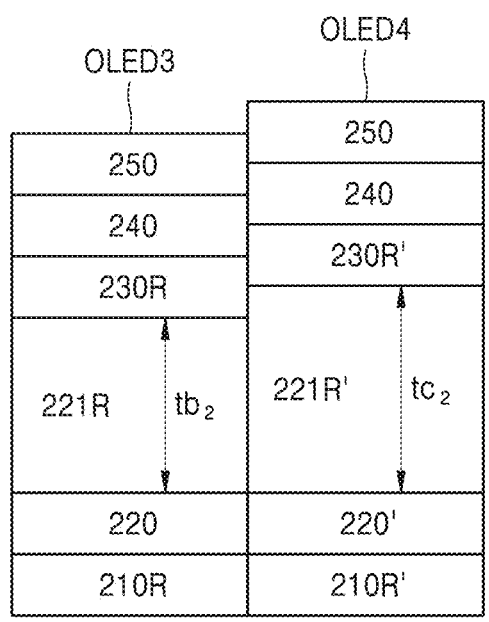
FIG. 9D is a diagram schematically illustrating a thickness comparison of layers of other display elements of FIG. 9A that are disposed in a bending area and a non-bending area.

FIG. 9A is a schematic cross-sectional view taken along line and line IV-IV' of FIG. 5 illustrating still another exemplary embodiment of the display panel. FIG. 9B is a diagram schematically illustrating a thickness comparison of layers of some of the display elements of FIG. 9A that emit light of colors different from each other. FIG. 9C is a diagram schematically illustrating a thickness comparison of layers of some of the display elements of FIG. 9A that are disposed in a bending area and a non-bending area. FIG. 9D is a diagram schematically illustrating a thickness comparison of layers of other display elements of FIG. 9A that are disposed in a bending area and a non-bending area. In FIG. 9A, the same reference numerals as those in FIG. 6 denote the same elements, and thus, repeated description thereof will be omitted for conciseness.

Referring to FIG. 9A, a first pixel electrode 210G is arranged in the first bending area BA1, and a first emission layer 230G corresponds to the first pixel electrode 210G. A second pixel electrode 210G' is arranged in the non-bending area NBA, and a second emission layer 230G' corresponds to the second pixel electrode 210G.

The first functional layer 220 is arranged between the first pixel electrode 210G and the first emission layer 230G, and the second functional layer 220' is arranged between the second pixel electrode 210G' and the second emission layer 230G. Also, a first auxiliary layer 221G is arranged between the first functional layer 220 and the first emission layer 230G, and a second auxiliary layer 221G' is arranged between the second functional layer 220' and the second emission layer 230G.

The first emission layer 230G and the second emission layer 230G' may emit light of the same first color, and the thickness $tb_1$ of the first auxiliary layer 221G may be less than a thickness $tc_1$ of the second auxiliary layer 221G.

According to another exemplary embodiment, a third pixel electrode 210R is arranged in the first bending area BA1, and a third emission layer 230R corresponds to the third pixel electrode 210R. A fourth pixel electrode 210R' is arranged in the non-bending area NBA, and a fourth emission layer 230R' corresponds to the fourth pixel electrode 210R'.

The first functional layer 220 is arranged between the third pixel electrode 210R and the third emission layer 230R, and the second functional layer 220' is arranged between the fourth pixel electrode 210R' and the fourth emission layer 230R'. Also, a third auxiliary layer 221R is arranged between the first functional layer 220 and the third emission layer 230R, and a fourth auxiliary layer 221R' is arranged between the second functional layer 220' and the fourth emission layer 230R'.

The third emission layer 230R and the fourth emission layer 230R' may emit light of the same second color different from the first color, and the thickness $tb_2$ of the third auxiliary layer 221R may be less than a thickness $tc_2$ of the fourth auxiliary layer 221R'.

According to an exemplary embodiment, the first emission layer 230G and the second emission layer 230G' may emit light of a green (G) wavelength, and the third emission layer 230R and the fourth emission layer 230R' may emit light of a red (R) wavelength.

Referring to FIG. 9A, the substrate 100 is in the first bending area BA1 and the non-bending area NBA, and the circuit layer 110 is arranged on the substrate 100. First to sixth circuit portions C1, C2, C3, C4, C5, and C6 are included and/or disposed in the circuit layer 110 and are connected to first to sixth pixel electrodes 210G, 210G', 210R, 210R', 210B, and 210B', respectively.

Also, the pixel-defining layer 120 is arranged on the first to sixth pixel electrodes 210G, 210G', 210R, 210R', 210B, and 210B' to cover edges of the first to sixth pixel electrodes 210G, 210G', 210R, 210R', 210B, and 210B' and partially expose the first to sixth pixel electrodes 210G, 210G', 210R, 210R', 210B, and 210B'. The first functional layer 220 and the second functional layer 220' cover the pixel-defining layer 120 and the first to sixth pixel electrodes 210G, 210G', 210R, 210R', 210B, and 210B'. The first functional layer 220 and the second functional layer 220' are merely named differently according to the first bending area BA1 and the non-bending area NBA. The first and second functional layers 220 and 220' may have the same or different thicknesses from each other.

In the first bending area BA1, the first auxiliary layer 221G is arranged on the first functional layer 220 to correspond to the first pixel electrode 210G, and the third auxiliary layer 221R corresponds to the third pixel electrode 210R. Also, a fifth emission layer 230B corresponds to the fifth pixel electrode 210B.

In the non-bending area NBA, the second auxiliary layer 221G' is arranged on the second functional layer 220' to correspond to the second pixel electrode 210G', and the fourth auxiliary layer 221R' corresponds to the fourth pixel electrode 210R'. Also, a sixth emission layer 230B' corresponds to the sixth pixel electrode 210B'.

The first emission layer 230G, the second emission layer 230G', the third emission layer 230R, and the fourth emission layer 230R' are arranged on the first auxiliary layer 221G, the second auxiliary layer 221G', the third auxiliary layer 221R, and the fourth auxiliary layer 221R', respectively. Also, the upper functional layer 240 covers the first functional layer 220, the second functional layer 220', and the first to sixth emission layers 230R, 230G, 230B, 230R', 230G', and 230B', and the opposite electrode 250 is arranged on the upper functional layer 240.

FIG. 9B illustrates layers of each of the first display element OLED1 and the third display element OLED3.

Referring to FIG. 9B, the thickness $tb_1$ of the first auxiliary layer 221G may be less than the thickness $tb_2$ of the third auxiliary layer 221R. This is because the first emission layer 230G and the third emission layer 230R may emit different light of colors such as green (G) light and red (R) light, respectively, and the optical distance may be adjusted accordingly.

FIGS. 9C and 9D illustrate layers of each of the first to fourth display elements OLED1 to OLED4.

Referring to FIGS. 9C and 9D, the thickness $tb_1$ of the first auxiliary layer 221G may be less than the thickness $tc_1$ of the second auxiliary layer 221G', and the thickness $tb_2$ of the third auxiliary layer 221R may be less than the thickness $tc_2$ of the fourth auxiliary layer 221R'.

If the thickness of an auxiliary layer arranged in a bending area is the same as that of an auxiliary layer arranged in a non-bending area, the viewing angle of the bending area may be different from that of the non-bending area depending on the refractive index, which causes a color perceived in the bending area to be different from a color perceived in the non-bending area.

For example, in the non-bending area, the white W obtained by uniformly combining the red R, the green G, and the blue B may be perceived, whereas, in the bending area, concentrations of the red R and the green G are increase and this may cause yellow Y to be perceived. Because the auxiliary layers are located under emission layers that emit the red (R) light and the green (G) light, movement is made in a direction +b and/or a direction +c in FIG. 11, resulting in the yellow Y.

Unlike this case, as in the illustrated embodiment, the thickness $tb_1$ of the first auxiliary layer 221G arranged in the first bending area BA1 may be less than the thickness $tc_1$ of the second auxiliary layer 221G' arranged in the non-bending area NBA, and the thickness $tb_2$ of the third auxiliary layer 221R arranged in the first bending area BA1 may be less than the thickness $tc_2$ of the fourth auxiliary layer 221R' arranged in the non-bending area NBA. In this case, the viewing angle of the first bending area BA1 may be adjusted to move the green Gin the direction +b and the red R in the direction +c in FIG. 11 back in a direction −b and a direction −c, respectively, and be located at the origin O displaying the intact white W. That is, the white W may be perceived instead of the yellow Y in the first bending area BA1, and the difference in the perceived colors between the first bending area BA1 and the non-bending area NBA may be improved and/or reduced. While a description has been given based on the first bending area BA1, the second bending area BA2 may be configured the same as the first bending area BA1.

When the thicknesses of the first auxiliary layer 221G and the third auxiliary layer 221R disposed in the bending area BA are adjusted, luminance ratios of red and green in the bending area BA may be controlled. Therefore, since the luminance ratio of red, green, and blue can be adjusted to be closer to 1:1:1, the color sense entering the field of view in the bending area BA may be white.

According to an exemplary embodiment, the thickness $tc_1$ of the second auxiliary layer 221G' may be about 285 Å, and the thickness $tb_1$ of the first auxiliary layer 221G may be about 142 Å to about 285 Å. Also, the thickness $tc_2$ of the fourth auxiliary layer 221R' may be about 775 Å, and the thickness $tb_2$ of the third auxiliary layer 221R may be about 387 Å to about 775 Å.

Figure 10A:
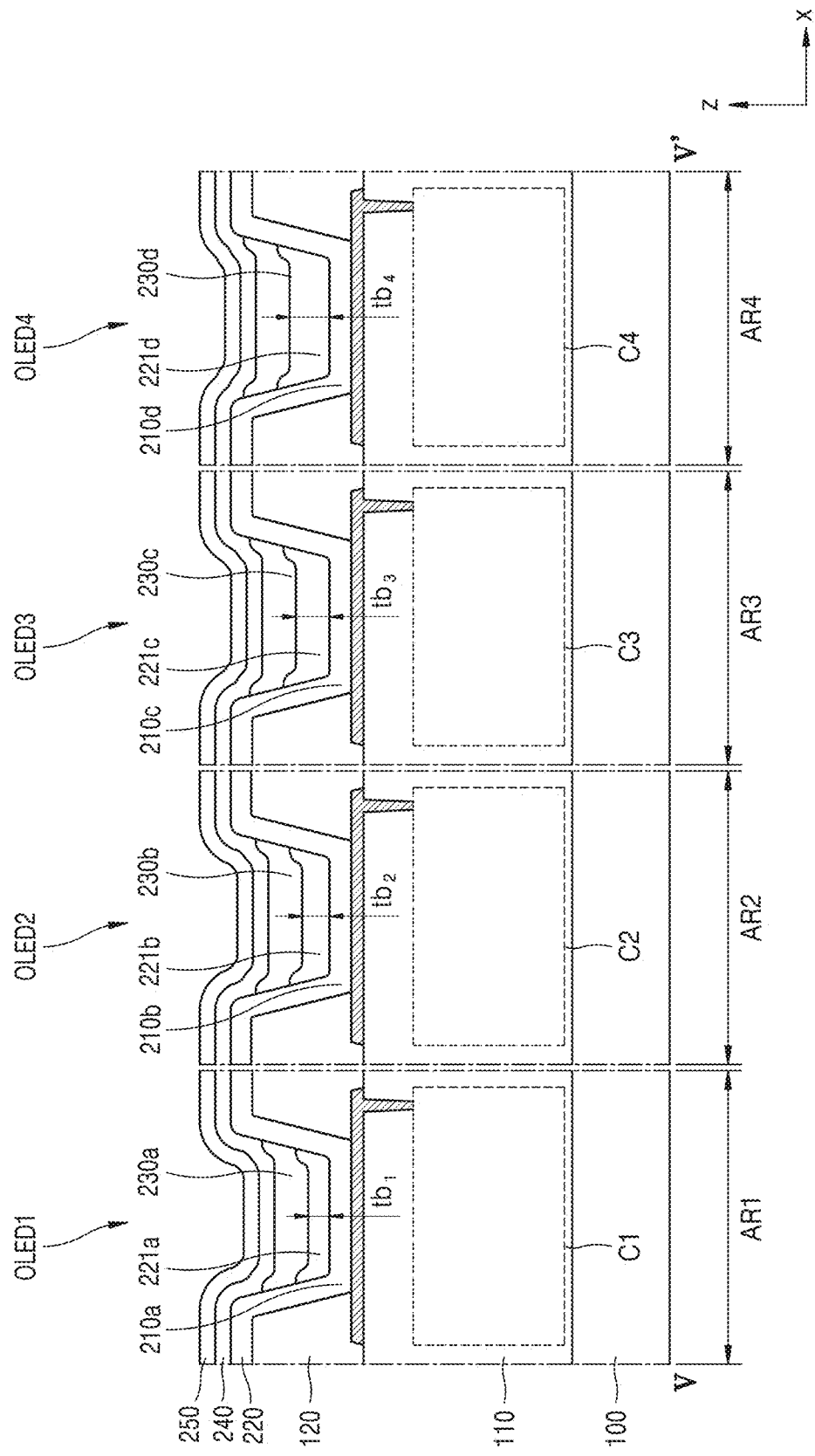
FIG. 10A is a schematic cross-sectional view taken along line V-V of FIG. 7 illustrating yet still another exemplary embodiment of the display panel.
Figure 10B:
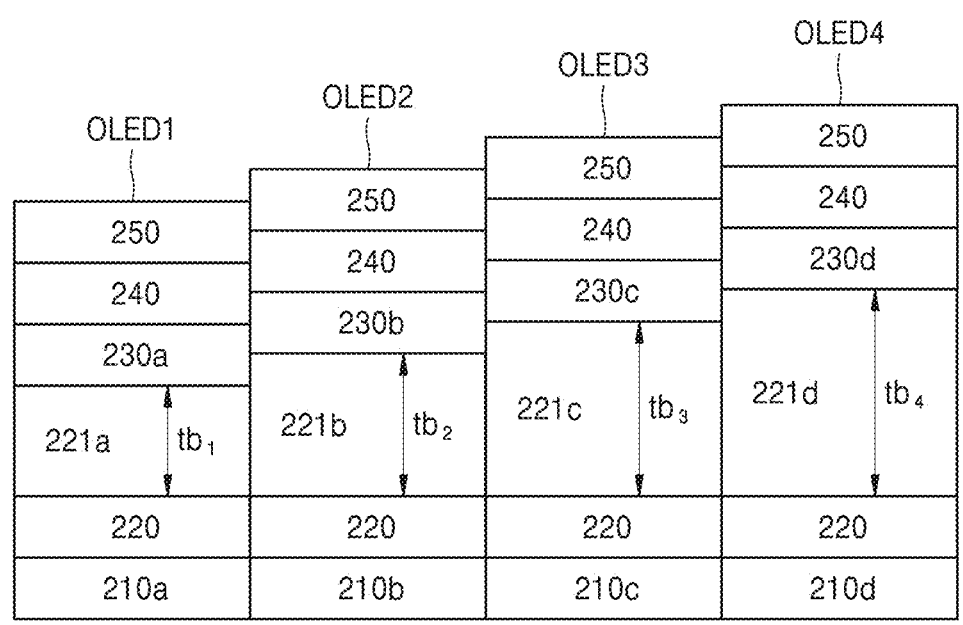
FIG. 10B is a diagram schematically illustrating a thickness comparison of certain layers of the display elements of FIG. 10A.

FIG. 10A is a schematic cross-sectional view taken along line V-V of FIG. 7 illustrating yet still another exemplary embodiment of the display panel. FIG. 10B is a diagram schematically illustrating a thickness comparison of certain layers of the display elements of FIG. 10A. In FIG. 10A, the same reference numerals as those in FIG. 8A denote the same elements, and thus, repeated description thereof will be omitted for conciseness.

FIG. 10A shows respective cross-sections of the first area AR1, the second area AR2, the third area AR3, and the fourth area AR4 of FIG. 7.

Referring to FIG. 10A, the circuit layer 110 may be arranged on the substrate 100, and the first to fourth circuit portions C1, C2, C3, and C4 are included and/or disposed in the circuit layer 110.

The first pixel electrode 210a, the second pixel electrode 210b, the third pixel electrode 210c, and the fourth pixel electrode 210d are connected to the first circuit portion C1, the second circuit portion C2, the third circuit portion C3, and the fourth circuit portion C4, respectively. Also, the pixel-defining layer 120 is arranged on the first to fourth pixel electrodes 210a to 210d to cover edges of the first to fourth pixel electrodes 210a to 210d and partially expose the first to fourth pixel electrodes 210a to 210d. Also, the first functional layer 220 covers the pixel-defining layer 120 and the first to fourth pixel electrodes 210a to 210d.

The first auxiliary layer 221a is arranged on the first functional layer 220 to correspond to the first pixel electrode 210a, and the second auxiliary layer 221b corresponds to the second pixel electrode 210b. Also, the third auxiliary layer 221c corresponds to the third pixel electrode 210c, and the fourth auxiliary layer 221d corresponds to the fourth pixel electrode 210d.

The first emission layer 230a, the second emission layer 230b, the third emission layer 230c, and the fourth emission layer 230d are arranged on the first auxiliary layer 221a, the second auxiliary layer 221b, the third auxiliary layer 221c, and the fourth auxiliary layer 221d, respectively. Also, the upper functional layer 240 covers the first functional layer 220 and the first to fourth emission layers 230a, 230b, 230c, and 230d, and the opposite electrode 250 is arranged on the upper functional layer 240.

While FIG. 10A shows the first to fourth areas AR1, AR2, AR3, and AR4 including first to fourth display elements OLED1, OLED2, OLED3, and OLED4, respectively, two or more display elements may be included in each of the first to fourth areas AR1, AR2, AR3, and AR4. The first to fourth display elements OLED1, OLED2, OLED3, and OLED4 may emit the light of the same color.

According to an exemplary embodiment, the thicknesses $tb_1$, $tb_2$, $tb_3$, and $tb_4$ of the first to fourth auxiliary layers 221a, 221b, 221c, and 221d may change according to the angles θ4, θ3, θ2, and θ1 shown in FIG. 3 between the imaginary line I extending from the non-bending area NBA and the tangent I' of any one of the first and second bending areas BA1 and BA2.

According to another exemplary embodiment, as the angles θ1, θ2, θ3, and θ4 between the imaginary line I extending from the non-bending area NBA and the tangent I' of the first and second bending areas BA1 and BA2 increase, the thicknesses $tb_4$, $tb_3$, $tb_2$, and $tb_1$ may decrease. A detailed description thereof is given below with reference to FIGS. 10B and 11.

FIG. 10B shows layers of each of the first to fourth display elements OLED1 to OLED4.

Referring to FIG. 10B, the thickness $tb_1$ of the first auxiliary layer 221a is least, and sequential increase occurs in order of the thickness $tb_2$ of the second auxiliary layer 221b, the thickness $tb_3$ of the third auxiliary layer 221c, and the thickness $tb_4$ of the fourth auxiliary layer 221d.

More specifically, as the curvature of the first and second bending areas BA1 and BA2 increases, the angles θ1, θ2, θ3, and θ4 between the imaginary line I extending from the non-bending area NBA and the tangent I' of the first and second bending areas BA1 and BA2 increase (θ1<θ2<θ3<θ4), and the thicknesses $tb_4$, $tb_3$, $tb_2$, and $tb_1$ may decrease sequentially according to a rate at which the angles θ1, θ2, θ3, and θ4 increase.

If a thickness of an auxiliary layer is the same throughout a bending area, the viewing angle of each point of the bending area may vary depending on the refractive index, and thus, difference in perceived color occurs at points of the bending area. As the curvature of the bending area increases, the viewing angle of each point of the bending area increases compared to a non-bending area, and this may cause a color perceived from a point of the bending area to be different from a color perceived in another point of the bending area. For example, concentrations of the red R and the green G may increase as the distance from the non-bending area increases, the accordingly yellow Y may be clearly perceived in the bending area furthest from the non-bending area. Because the auxiliary layers are located under emission layers that emit the red (R) light and the green (G) light, movement is made in the direction +b and/or the direction +c in FIG. 11, resulting in the yellow Y. Specifically, when the emission layer emits the green (G) light, a movement is made in the direction +b, and when the emission layer emits the red (R) light, a movement is made in the direction +c.

Unlike this case, in the illustrated exemplary embodiment, the thicknesses $tb_4$, $tb_3$, $tb_2$, and $tb_1$ may be differentially formed according to at the amount by which the angles θ1, θ2, θ3, and θ4 between the imaginary line I extending from the non-bending area NBA and the tangent I' of the first and second bending areas BA1 and BA2 increase. In this case, the viewing angle of each of the first area AR1, the second area AR2, the third area AR3, and the fourth area AR4 may be adjusted to move the green G in the direction +b and the red R in the direction +c in FIG. 11 back in the direction −b and the direction −c, respectively, and be located at the origin O displaying the intact white W. That is, the white W may be perceived instead of the yellow Y in the first bending area BA1, and the difference in perceived colors between the first bending area BA1 and the non-bending area NBA and between the first to fourth areas AR1 to AR4 may be improved and/or reduced. While a description has been given based on the first bending area BA1, the second bending area BA2 may be configured the same as the first bending area BA1.

FIG. 11 is a graph of chromaticity.

Referring to FIG. 11, each of the three vertices corresponds to the red R, the green G, and the blue B, and the origin O refers to the white W obtained by uniformly combining the red R, the green G, and the blue B.

The direction a denotes a color change according to a change of the thicknesses tb and tc shown in FIG. 6 of the first and second functional layers 220 and 220', and this corresponds to the change of the color obtained by combining all of the red R, the green G, and the blue B. As described with reference to FIG. 6, according to the illustrated embodiment, when the thickness tb of the first functional layer 220 is greater than the thickness tc of the second functional layer 220', movement is made in the direction +a, and compared to a case in which the thickness tb of the first functional layer 220 and the thickness tc of the second functional layer 220' are the same as each other, relatively the white W is perceived.

The direction b denotes a color change according to a change of the thicknesses $tb_1$, $tb_2$, $tb_3$, and $tb_4$ shown in FIG. 10A of the first to fourth auxiliary layers 221a, 221b, 221c, and 221d arranged under the first to fourth emission layers 230a, 230b, 230c, and 230d where the green (G) light is emitted, and this corresponds to the change of a concentration of the green G. As described with reference to FIG. 10A, according to the illustrated exemplary embodiment, the thicknesses $tb_4$, $tb_3$, $tb_2$, and $tb_1$ may be differentially formed according to the amount by which the angles θ1, θ2, θ3, and θ4 between the imaginary line I extending from the non-bending area NBA and the tangent I' of the first and second bending areas BA1 and BA2 increase, and in this case, movement is made in the direction −b.

The direction c denotes a color change according to a change of the thicknesses $tb_1$, $tb_2$, $tb_3$, and $tb_4$ of the first to fourth auxiliary layers 221a, 221b, 221c, and 221d arranged under the first to fourth emission layers 230a, 230b, 230c, and 230d where the red (R) light is emitted, and this corresponds to a change in the concentration of the red R. As described with reference to FIG. 10A, according to the illustrated embodiment, the thicknesses $tb_4$, $tb_3$, $tb_2$, and $tb_1$ may be differentially formed according amount by which the angles θ1, θ2, θ3, and θ4 between the imaginary line I extending from the non-bending area NBA and the tangent I' of the first and second bending areas BA1 and BA2 increase, and in this case, a movement is made in the direction −c.

By adjusting the color change in the direction b and the direction c according to the illustrated exemplary embodiment, the color perceived in the first and second bending areas BA1 and BA2 may be adjusted to be located near the origin O. Accordingly, white (W) light may be perceived, and the change in the color perceived as the yellow Y may be improved and/or reduced.

Figure 12:
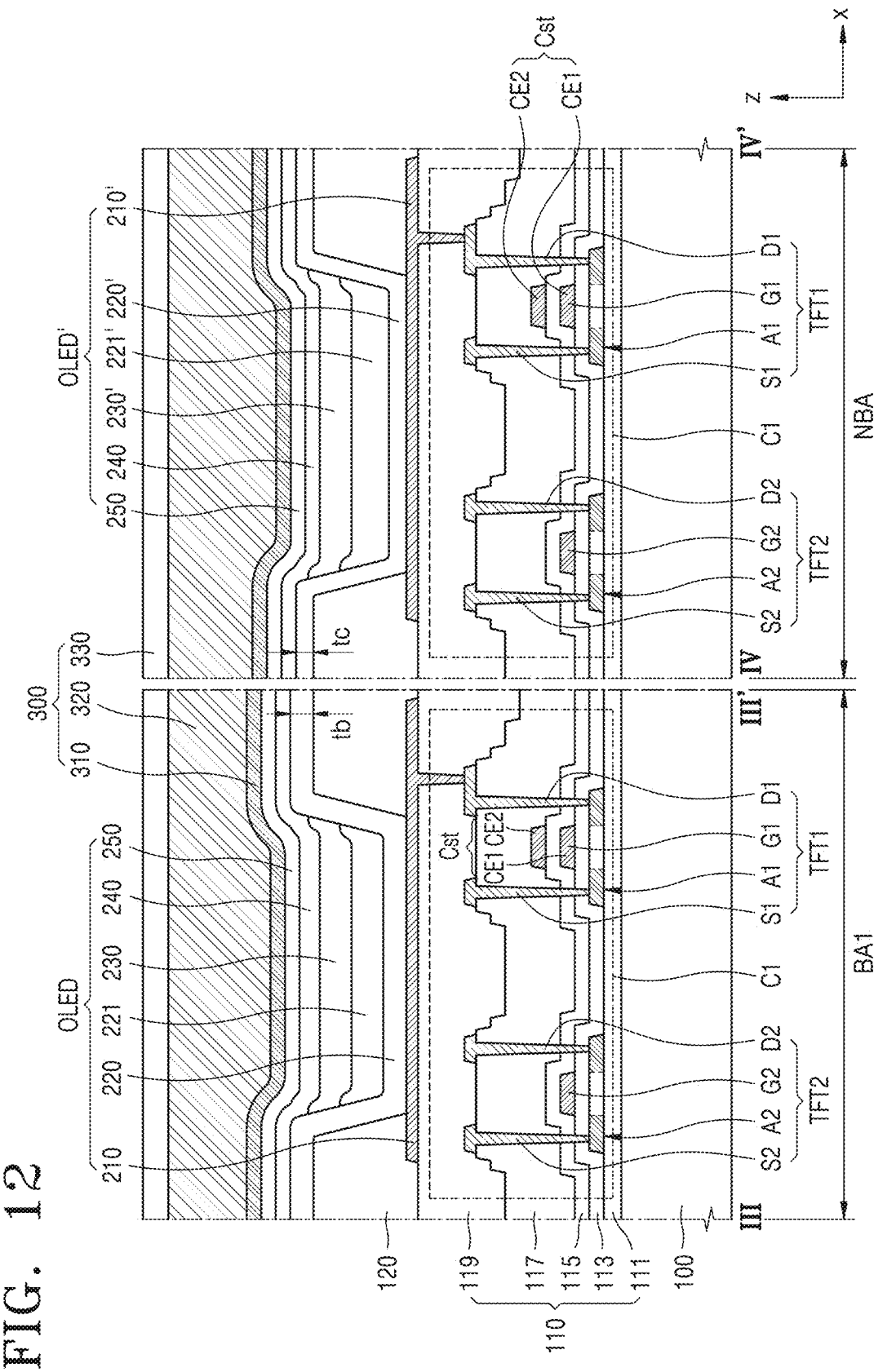
FIG. 12 is a schematic cross-sectional view taken along line and line IV-IV' of FIG. 5 illustrating still yet another exemplary embodiment of the display panel.

FIG. 12 is a schematic cross-sectional view taken along line and line IV-IV' of FIG. 5 illustrating still yet another exemplary embodiment of the display panel.

Referring to FIG. 12, a display apparatus may further include a thin film encapsulation layer 300 on the organic light-emitting diodes OLED and OLED'.

The organic light-emitting diodes OLED and OLED' may be easily damaged due to external moisture or oxygen and thus may be covered and protected by the thin film encapsulation layer 300. The thin film encapsulation layer 300 may cover the display area DA and may extend to the outside of the display area DA. The thin film encapsulation layer 300 includes at least one organic encapsulation layer and at least one inorganic encapsulation layer. For example, the thin film encapsulation layer 300 may include a first inorganic encapsulation layer 310, an organic encapsulation layer 320, and a second inorganic encapsulation layer 330.

The first inorganic encapsulation layer 310 may cover a capping layer and may include silicon oxide, silicon nitride and/or silicon trioxynitride. The first inorganic encapsulation layer 310 is formed along a lower structure thereof, and thus, an upper surface of the first inorganic encapsulation layer 310 is not flat. The organic encapsulation layer 320 may cover the first inorganic encapsulation layer 310, and unlike the first inorganic encapsulation layer 310, an upper surface of the organic encapsulation layer 320 may be substantially flat. Specifically, the organic encapsulation layer 320 may have an upper surface substantially flat in the display area DA. The organic encapsulation layer 320 may include one or more materials selected from the group consisting of polyethylene terephthalate, polyethylene naphthalate, polycarbonate, polyimide, polyethylenesulfonate, polyoxymethylene, polyarylate, and HMDSO. The second inorganic encapsulation layer 330 may cover the organic encapsulation layer 320 and may include silicon oxide, silicon nitride and/or silicon trioxynitride.

Through a multilayer structure described above, even when a crack occurs in the thin film encapsulation layer 300, the thin film encapsulation layer 300 may prevent the crack from being connected between the first inorganic encapsulation layer 310 and the organic encapsulation layer 320 or between the organic encapsulation layer 320 and the second inorganic encapsulation layer 330. Thus, formation of a path through which external moisture or oxygen penetrates into the display area DA may be prevented or reduced.

According to another exemplary embodiment, a sealing substrate facing the substrate 100 may be arranged. This may be sealed by attaching the substrate 100 and the sealing substrate to each other with a sealing material such as frit in the non-display area NDA shown in FIG. 1.

As in the illustrated embodiment, the thickness tb of the first functional layer 220 arranged in the first bending area BA1 may be greater than the thickness tc of the second functional layer 220' arranged in the non-bending area NBA, and accordingly, the viewing angle in the first bending area BA1 may be adjusted to display the white W in the first bending area BA1 as in the non-bending area NBA.

While display apparatus has been mainly described above, exemplary embodiments of the invention are not limited thereto. For example, a display apparatus manufacturing method for manufacturing such a display apparatus may be implemented according to the principles of the invention.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
a substrate comprising a substantially flat area and a curved area extending and being bent from the substantially flat area;
a first pixel electrode arranged in the curved area;
a first emission layer overlapping the first pixel electrode;
a second pixel electrode arranged in the substantially flat area;
a second emission layer overlapping the second pixel electrode;
a first functional layer disposed in the curved area between the first pixel electrode and the first emission layer;
a second functional layer disposed in the substantially flat area between the second pixel electrode and the second emission layer;
a first auxiliary layer having a first auxiliary thickness disposed between the first functional layer and the first emission layer; and
a second auxiliary layer having a second auxiliary thickness disposed between the second functional layer and the second emission layer,
wherein the first emission layer and the second emission layer are configured to emit light of the same color,
wherein the first functional layer and the second functional layer have different thicknesses, and
wherein the first auxiliary thickness is less than the second auxiliary thickness.

2. A display apparatus comprising:
a substrate comprising a substantially flat area and a curved area extending and being bent from the substantially flat area;
a first pixel electrode arranged in the curved area;
a first emission layer disposed on the first pixel electrode:
a second pixel electrode arranged in the substantially flat area and being bent at a certain radius curvature;
a second emission layer disposed on the second pixel electrode;

a first functional layer having a first thickness disposed in the curved area between the first pixel electrode and the first emission layer;
a second functional layer having a second thickness disposed in the substantially flat area between the second pixel electrode and the second emission layer;
a first auxiliary layer having a first auxiliary thickness disposed between the first functional layer and the first emission layer; and
a second auxiliary layer having a second auxiliary thickness disposed between the second functional layer and the second emission layer,
wherein the first emission layer and the second emission layer are configured to emit light of a first color,
wherein the first thickness is greater than the second thickness, and
wherein the first auxiliary thickness is less than the second auxiliary thickness.

3. The display apparatus of claim 2, wherein the first functional layer and the second functional layer comprise hole injection layers.

4. The display apparatus of claim 2, wherein the first functional layer and the second functional layer are integrally formed.

5. The display apparatus of claim 2, further comprising:
a third pixel electrode arranged in the curved area;
a third emission layer disposed on the third pixel electrode; and
a third functional layer having a third thickness disposed between the third pixel electrode and the third emission layer,
wherein the third pixel electrode is spaced further apart from the substantially flat area than the first pixel electrode, and
wherein the third thickness is greater than the first thickness.

6. The display apparatus of claim 5, further comprising:
a third auxiliary layer having a third auxiliary thickness disposed between the third functional layer and the third emission layer,
wherein the third auxiliary thickness is less than the first auxiliary thickness.

7. The display apparatus of claim 2, wherein the first auxiliary thickness varies such that left and right edge portions of the first functional layer have a greater thickness than a central portion of the first functional layer between the left and right edge portions.

8. The display apparatus of claim 7, wherein the first auxiliary thickness decreases as the angle increases.

9. The display apparatus of claim 2, wherein the first thickness varies according to an angle between an imaginary line parallel to an upper surface of the substantially flat area and a tangent of a point on an upper surface of the curved area.

10. The display apparatus of claim 9, wherein the first emission layer has a third thickness that varies such that left and right edge portions of the first emission layer have a greater thickness than a central portion of the first functional layer between the left and right edge portions.

11. A display apparatus comprising:
a substrate comprising a substantially flat area and a curved area extending and being bent from the substantially flat area;
a first pixel electrode arranged in the curved area;
a first emission layer overlapping the first pixel electrode;
a second pixel electrode arranged in the substantially flat area;
a second emission layer overlapping the second pixel electrode;
a third pixel electrode arranged in the curved area;
a third emission layer overlapping the third pixel electrode;
a first functional layer having a first thickness disposed in the curved area between the first pixel electrode and the first emission layer;
a second functional layer disposed in the substantially flat area between the second pixel electrode and the second emission layer;
a third functional layer having a third thickness disposed between the third pixel electrode and the third emission layer;
a first auxiliary layer having a first auxiliary thickness disposed between the first functional layer and the first emission layer;
a second auxiliary layer having a second auxiliary thickness disposed between the second functional layer and the second emission layer; and
a third auxiliary layer having a third auxiliary thickness disposed between the third functional layer and the third emission layer,
wherein the first emission layer and the second emission layer are configured to emit light of a first color,
wherein the third pixel electrode is spaced further apart from the substantially flat area than the first pixel electrode,
wherein the third thickness is greater than the first thickness,
wherein the first auxiliary thickness is less than the second auxiliary thickness, and
wherein the third auxiliary thickness is less than the first auxiliary thickness.

12. The display apparatus of claim 11,
wherein the third emission layer is configured to emit the light of the first color.

13. The display apparatus of claim 11, wherein the first auxiliary layer and the second auxiliary layer are separated from each other.

14. The display apparatus of claim 11, further comprising:
a fourth pixel electrode arranged in the substantially flat area;
a fourth emission layer overlapping to the fourth pixel electrode;
a fourth functional layer disposed between the fourth pixel electrode and the fourth emission layer; and
a fourth auxiliary layer having a fourth auxiliary thickness disposed between the fourth functional layer and the fourth emission layer,
wherein the third emission layer and the fourth emission layer are configured to emit light of a second color different from the first color, and
wherein the third auxiliary thickness is less than the fourth auxiliary thickness.

15. The display apparatus of claim 14, wherein the light of the first color has a red wavelength, and the light of the second color has a green wavelength.

16. The display apparatus of claim 11, wherein the first auxiliary thickness varies according to an angle between an imaginary line parallel to an upper surface of the substantially flat area and a tangent of a point on an upper surface of the curved area.

17. The display apparatus of claim 16, wherein the first auxiliary thickness decreases as the angle increases.

18. The display apparatus of claim 11, wherein the first functional layer and the second functional layer are integrally formed.

\* \* \* \* \*